(12) United States Patent
Gabara et al.

(10) Patent No.: US 6,249,192 B1
(45) Date of Patent: Jun. 19, 2001

(54) CLOCK INJECTION SYSTEM

(75) Inventors: Thaddeus John Gabara, Murray Hill; Syed Aon Mujtaba, Berkeley Heights, both of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/311,589

(22) Filed: May 14, 1999

Related U.S. Application Data
(60) Provisional application No. 60/072,602, filed on Jan. 26, 1998, and provisional application No. 60/115,099, filed on Jan. 7, 1999.

(51) Int. Cl.$^7$ .................................................... H03B 5/12
(52) U.S. Cl. .............. 331/117 R; 331/172; 331/117 FE; 331/167; 327/165; 327/166
(58) Field of Search ............................ 331/36 C, 117 R, 331/172 FE, 167; 341/68; 455/265; 375/376, 354; 327/165, 166

(56) References Cited

U.S. PATENT DOCUMENTS

| | | | |
|---|---|---|---|
| 4,918,406 | * 4/1990 | Baumbach et al. | 331/117 R |
| 5,396,195 | 3/1995 | Gabara | 331/113 R |

* cited by examiner

*Primary Examiner*—Arnold Kinkead
(74) *Attorney, Agent, or Firm*—William H. Bollman

(57) ABSTRACT

A tuning signal is injected into an LC tank circuit oscillator, e.g., through an impedance (either reactive, inductive, capacitive and/or resistive) to tune the phase and/or frequency of the LC tank circuit oscillator. A negative resistance is included in parallel with the LC tank circuit oscillator to compensate for losses in the LC tank circuit, and a bias signal is provided to power the operation of the LC tank circuit. The tuning signal may be, e.g., an AC signal or a data signal. The tuning signal is injected into the LC tank circuit using capacitors, resistors, FET or bipolar transistors, and/or inductors. Multiple LC tank circuit oscillators may be used to provide stable multiplied or divided frequencies. In this case, the output of one LC tank circuit oscillator may be used to tune another LC tank circuit oscillator. In another embodiment, the nominal frequency of the LC tank circuit oscillator may be adjusted using a varactor or other voltage-controlled element in the LC tank circuit oscillator under the control of, e.g., the output of a separate PLL loop including another LC tank circuit oscillator. In one application, the injection tuned LC tank circuit forms a clock recovery cell using a clock signal embedded in a NRZ (Non Return to Zero) pseudo-random data stream. The slave oscillator in turn generates a recovered clock signal. Differential clock recovery can be performed with as little as four active devices.

21 Claims, 19 Drawing Sheets

CLOCK AND DATA RECOVERY

CLOCK AND DATA RECOVERY

THE MEASURED SPECTRUM OF 3GB/s NRZ DATA WITH AN
EXPANSION AT 3GHz SHOWING THE EMBEDDED CLOCK SIGNAL

EMBEDDED CLOCK

TERMINATING IMPEDANCE

DE-COMPOSING NRZ SIGNALS

CLOCK INJECTION SYSTEM

This application claims priority from U.S. Appl. No. 60/072,602, filed Jan. 26, 1998, entitled "Synchronous Carrier Recovery Circuits and Injection Tuned Resonant Circuits"; U.S. Appl. No. 09/134,602, filed Aug. 14, 1998, entitled "Injection Tuned Resonant Circuits" now U.S. Pat. No. 6,175,285; U.S. Appl. No. 60/115,099, filed Jan. 7, 1999, entitled "Injection Tuned Resonant Circuits"; and U.S. Appl. No. 09/236,675, filed Jan. 26, 1999, entitled "Clock Recovery Using An Injection Tuned Resonant Circuit", the specification of each of which is explicitly incorporated herein by reference.

FIELD OF THE INVENTION

This invention relates generally to the recovery of a data clock signal by injecting a data signal into an LC tank circuit to control an oscillating frequency thereof. More particularly, it relates to the injection of a single-ended or balanced (differential) data signal into an LC tank circuit to recover the clock signal for the received data by tuning the oscillating frequency of the LC tank circuit.

BACKGROUND OF THE INVENTION

Oscillators are common devices used in a wide variety of devices, including radio equipment and modems. Oftentimes, the oscillator must be extremely stable and accurate, but as frequencies of devices increase and as the integration of components in integrated circuits increases, oscillator design and operation become extremely challenging.

For many systems, an oscillator exhibiting an oscillation frequency within a small range of a particular value is required. Pre-screening of oscillator devices and/or of the components in the oscillator device permits selection of an oscillator having as accurate a frequency as is required for the particular application. However, pre-screening is expensive and results in low yields.

Crystal oscillators, while having a high quality factor (Q factor), are not conventionally formed on an integrated circuit. On the other hand, inductor/capacitor (LC) tank circuits, another form of oscillator, have been used to provide an oscillator on an integrated circuit, albeit with a lower Q factor.

One way to improve the precision of the oscillation is to use closed-loop techniques for synchronizing an oscillator frequency and/or phase, either to an input signal such as a data stream or to a predetermined reference oscillator. Perhaps the most prevalent closed-loop technique for synchronizing an oscillator to another signal is with the use of a phase-locked loop (PLL), e.g., as shown in FIG. 1.

In particular, FIG. 1 shows the use of a PLL 400 to sense a frequency and phase of a carrier in an incoming modulated signal. The PLL 400 provides a phase and frequency corrected recovered carrier signal to the phase/frequency detector 102 for comparison with the actually received modulated signal (which due to real world conditions contains noise in the form of phase and frequency variations).

In FIG. 1, a phase/frequency detector 102 receives both the incoming modulated signal on line 420 and the output of the PLL 400 at point 422. The phase/frequency detector 102 compares the phase and frequency of the received modulated signal on line 420 with the phase and frequency generated by the PLL 400 to detect the actual phase and frequency of the carrier frequency as it is received in the receiver. This accurately determined carrier frequency is subtracted from the received modulated signal to result in an output of the recovered information signal.

In more detail, the received modulated signal is input to the PLL 400 at line 420. A band pass filter 408 band pass filters the input modulated signal such that sideband information beyond that desired is eliminated. A phase detector 406, charge pump 404 and loop filter 402 provide a comparative phase for the received modulated signal and the locally sensed carrier frequency, and generate a DC signal for control of a voltage controlled oscillator (VCO) 430. The VCO 430 outputs a particular frequency based on the voltage level of its control input.

While having certain advantages, the requirement of a PLL adds cost and complexity to a circuit, which is of particular concern in lower end applications such as low end cordless telephones or other wireless applications. Moreover, the closed-loop nature of the PLL slows the acquisition time necessary to acquire phase lock with changes in the input signal, and thus may limit the maximum frequency, modulation and overall performance of the receiver in certain applications.

There is thus a need to provide an open-loop oscillator circuit which is capable of being formed in an integrated circuit and which is capable of highly precise and accurate operation.

SUMMARY OF THE INVENTION

In accordance with the principles of the present invention, a clock injection system comprises a clocked logic element, and a parasitic capacitance between an input clock signal to the clocked logic element and an output data signal from the clocked logic element. In addition, a capacitor is connected between the input clock signal and the output data signal. The capacitor increases an energy of the clock signal embedded in the output data signal due to the parasitic capacitance.

A method of injecting a clock signal into a data signal in accordance with another aspect of the present invention comprises intentionally increasing a capacitance between a clock signal and an output data signal to increase energy of the clock signal embedded in the output data signal.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
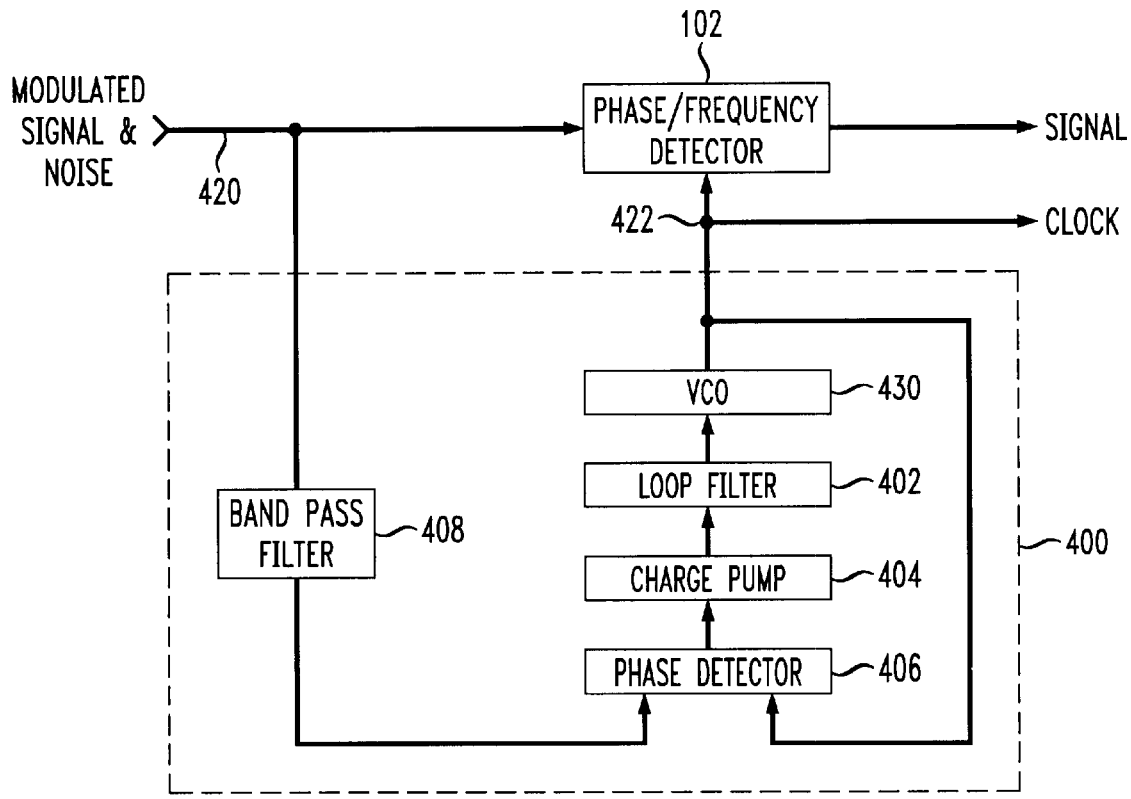
FIG. 1 shows the conventional use of a phase locked loop to sense a frequency and phase of a carrier in a modulated signal.

The present invention provides an injection locked oscillator which is capable of tuning to an injection signal in general. The injection signal may be an AC injection signal in one aspect, or a data signal in another aspect. In any event, the injection signal has at least one frequency component. The present invention is capable of recovering an extremely high speed clock signal relating to an underlying data signal. The injection tuned LC tank circuit oscillator in accordance with the principles of the present invention is capable of being formed on one or more integrated circuits, although it may also include discrete components.

For instance, in one aspect, an injection locking signal is injected into the LC tank circuit oscillator, e.g., through an impedance (either reactive, inductive, capacitive and/or resistive) to tune the phase and/or frequency of the LC tank circuit oscillator. The injection locking signal may be injected either single-ended into only one node of the LC tank circuit with the other node(s) being appropriately grounded or otherwise terminated, differentially into two nodes of the LC tank circuit, or with more than two injection signals. When the injection locking signal is injected with more than one path to the LC tank circuit, the injected signals are phase shifted from one another.

As background, the present invention is a result of the inventor's appreciation that an oscillator may be frequency locked with another oscillator under certain conditions. To this end, a test integrated circuit was fabricated in 0.5 micron CMOS technology. The test circuit consisted of a gated ring oscillator having a tap point driving a very large capacitance into the substrate of an integrated circuit. A second data path having an externally applied clock signal was used to drive a second large capacitance into the substrate. The ring oscillator was enabled and a frequency around 10 megahertz (MHz) was observed at the output node of an output buffer driving a low logic level formed in the integrated circuit.

When the external clock signal had a frequency significantly less than 10 MHz, separate frequency peaks of both the external clock signal and the 10 MHz frequency of the ring oscillator were observed on a spectrum analyzer, indicating that the oscillation of the ring oscillator had not locked to the frequency of the externally applied clock signal. However, as the frequency of the external clock signal was increased toward the natural frequency of the ring oscillator, the two frequency peaks observed on the spectrum analyzer became joined at the frequency of the external clock signal, indicating that the ring oscillator had become tuned to the frequency of the external clock signal injected into the substrate. Moreover, the ring oscillator was observed to remain locked to the frequency of the external clock signal even with slight variations in the frequency of the external clock signal from the natural frequency of the ring oscillator, e.g., for variations of about a few percent around the natural frequency of the ring oscillator.

A second test structure was formed using 0.35 $\mu$m CMOS technology. A data path was connected capacitively to an on-chip ring oscillator, this time not through the substrate but through metal I/metal II capacitance. The ring oscillator was observed to lock or tune to the frequency of a separate clock signal applied to the data path in this test as well.

The test ring oscillator did not initially lock to an intermittent clock signal, e.g., an injection clock signal carrying pseudo-random data.

However, through simulations, the use of a band pass filter to isolate a particular frequency range in the data signal allowed the test ring oscillator to lock onto the injected clock signal carrying pseudo-random data.

Although these test and simulation results were encouraging, a common disadvantage to ring oscillators is their limited ability to generate high frequency signals. For instance, in 0.35 µm CMOS technology, clock and data recovery is very difficult at very high frequencies, e.g., at 1.25 Gb/s, mostly due to the minimum gate delay inherent in an inverter stage and the need to connect several inverters in series to form the ring oscillator. Thus, to achieve higher bit rates, it was recognized by the present inventor that it would be necessary to form an oscillator capable of running at comparably higher frequencies with controlled phase characteristics.

The embodiments of the present invention utilize an inductor-capacitor (LC) tank circuit, which not only can be formed in integrated circuit form but is also capable of extremely high oscillation. However, particularly because of the low quality factor of an inductor formed in silicon, a positive feedback circuit may be required to sustain the oscillation of an LC tank circuit.

Suitable LC tank circuit oscillators are shown and described in U.S. Pat. No. 5,396,195 entitled "low-power low dissipation CMOS oscillator circuits", by the same inventor as herein, the contents of which are expressly incorporated herein by reference.

An LC tank circuit oscillator is advantageous to carry out the principles of the present invention, e.g., because energy can be injected effectively into one or more nodes of the LC tank circuit oscillator. In accordance with the principles of the present invention, an LC tank circuit is phase and/or frequency locked to a signal injected into one or more nodes of the LC tank circuit.

Figure 2:
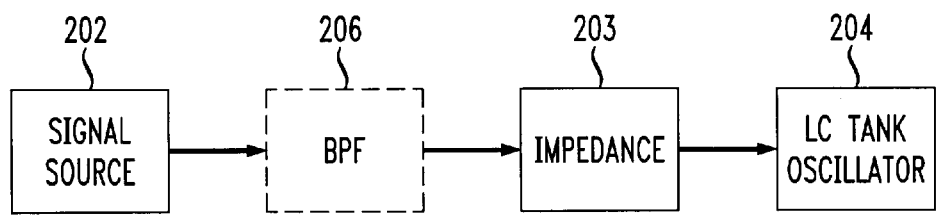
FIG. 2 is a general block diagram showing the injection of a tuning signal into an LC tank circuit oscillator via an impedance.

FIG. 2 is a general block diagram showing the main elements of the present embodiment. In particular, FIG. 2 shows the injection of a signal source 202 into an LC tank circuit oscillator 204 via an impedance 203 and optional band pass filter 206.

The signal source 202 may be any suitable clock signal, preferably but not necessarily sine wave in nature, but which is within a tunable range of the LC tank circuit oscillator 204. If the signal source 202 provides a clock signal which is intermittent, e.g., as with pseudo-random data, the band pass filter 206 may be, but not necessarily, interjected between the signal source 202 and the impedance 203 to isolate the tuning frequency of interest.

The impedance 203 may be capacitive, inductive, or resistive, so long as it does not otherwise interfere with the performance of the LC tank circuit oscillator 204.

The LC tank circuit oscillator 204 may be, e.g., as described in U.S. Pat. No. 5,396,195, and/or as shown in more detail in FIG. 3 herein.

Figure 3:
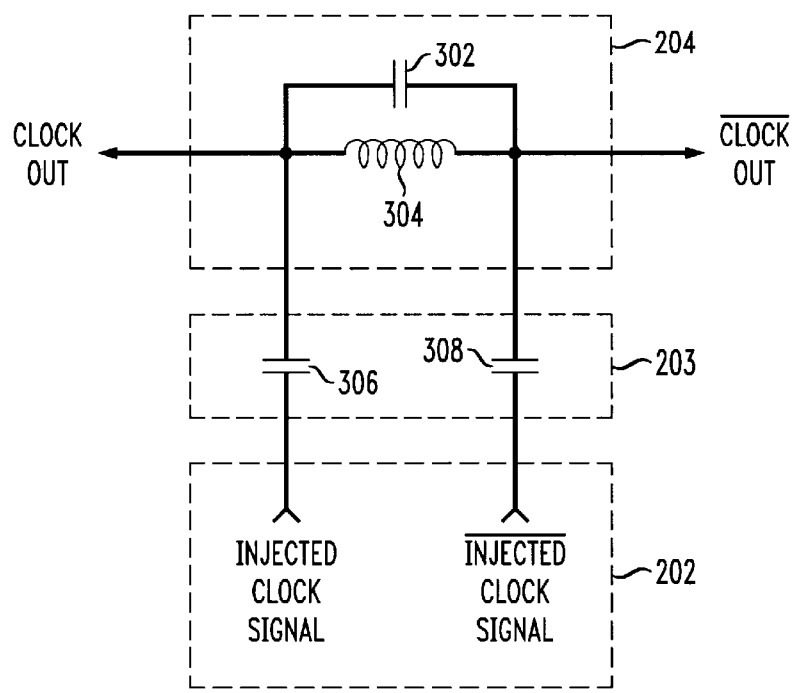
FIG. 3 shows an ideal LC tank circuit including a clock signal injected through an impedance into the LC tank circuit.

In particular, FIG. 3 shows an ideal LC tank circuit including a capacitor 302 in parallel with an inductor 304. FIG. 3 also shows a capacitive impedance 203 including capacitors 306 and 308. However, the LC tank circuit in reality has loss because of, e.g., resistance in the inductor, and thus requires the addition of negative resistance to operate effectively.

Figure 4:
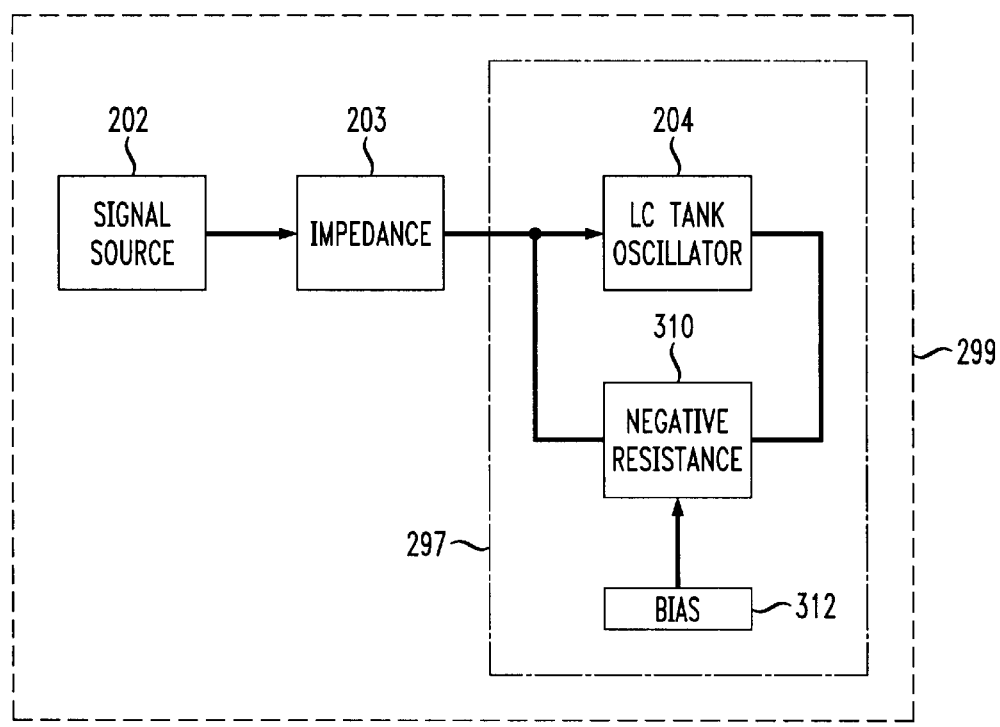
FIG. 4 shows the inclusion of negative resistance and bias in a real-world LC tank circuit oscillator to provide power to the LC tank circuit oscillator.

FIG. 4 shows the inclusion of negative resistance 310 in parallel with the LC tank circuit oscillator 204 to provide power for the perpetual operation of the LC tank circuit oscillator 204. A bias signal 312 is provided to the LC tank circuit oscillator 204 to provide power to the LC tank circuit oscillator for operation.

Figure 5:
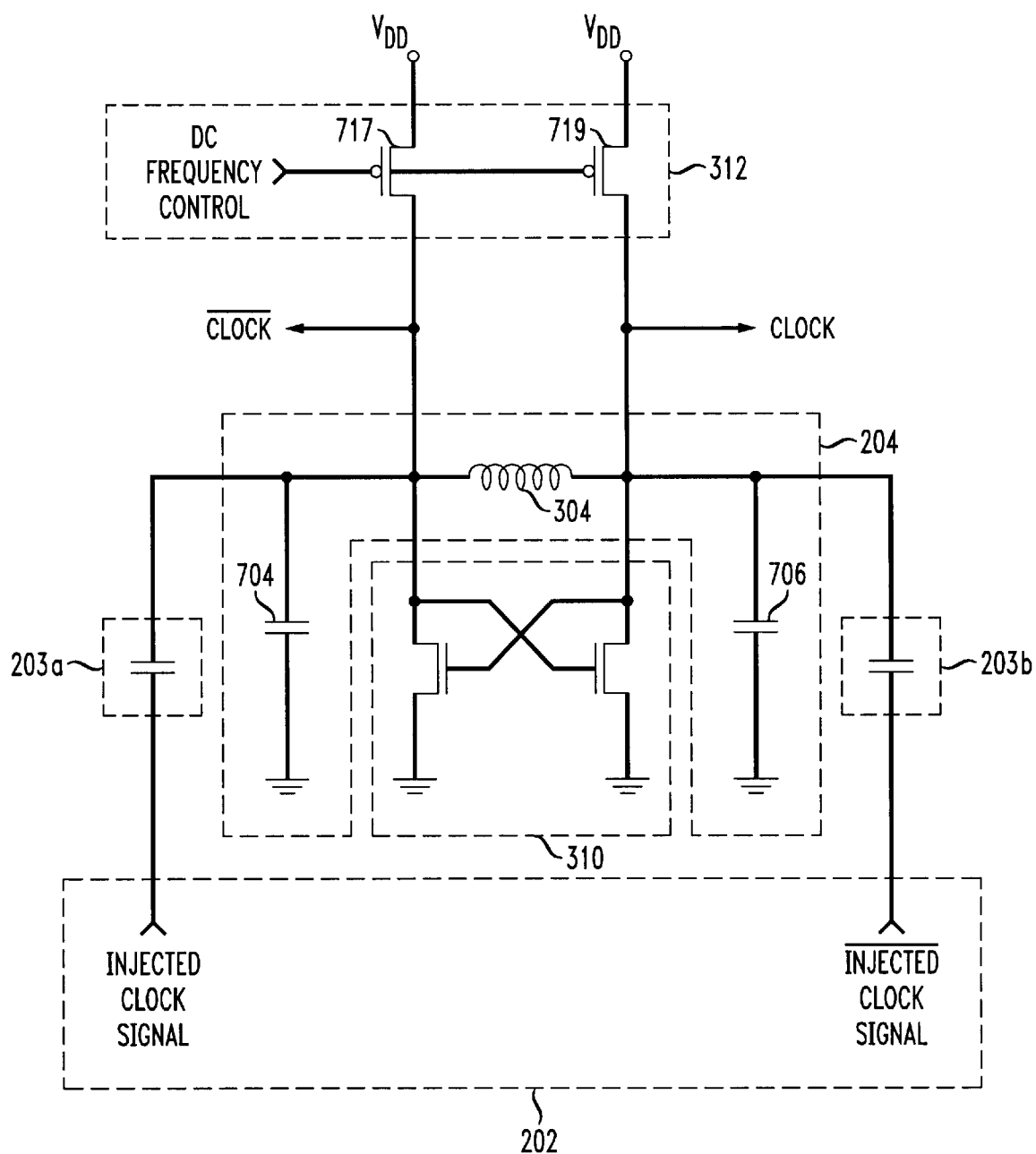
FIG. 5 is a more detailed diagram of the circuit shown in FIG. 4.

FIG. 5 shows a detailed circuit diagram of the embodiment shown in FIG. 4.

In FIG. 5, the LC tank circuit 204 is formed by an inductor 304 in series with capacitors 704 and 706 both connected to ground, which is an equivalent circuit of an inductance in parallel with a capacitance. Another possible LC tank circuit configuration is a capacitor in series with two inductors each tied to ground. The capacitance of the LC tank circuit should include the parasitic capacitance of the included elements, e.g., capacitances in the negative resistance circuit 310. Similarly, the inductance of the LC tank circuit should include the inductance of any wiring or other elements.

The bias 312 may be provided by two p-channel metal oxide semiconductor field effect transistors (MOSFETs) 717, 719, e.g., as shown in FIG. 5. The bias provides the LC tank circuit oscillator 204 with power for operation.

To speed up operation of the LC tank circuit oscillator and/or to assist the LC tank circuit oscillator in achieving stable oscillation, a DC start-up signal may be provided as shown in FIG. 1 of U.S. Pat. No. 5,396,195.

The negative resistance 310 can be, e.g., a cross-coupled MOS structure as shown in FIG. 5. The cross-coupled MOS structure provides a negative resistance which is used in conjunction with the LC tank circuit to sustain oscillation. Alternatively, the negative resistance could be provided by cross-coupled MOS devices as in a conventional random access memory (RAM) structure.

Figure 6:
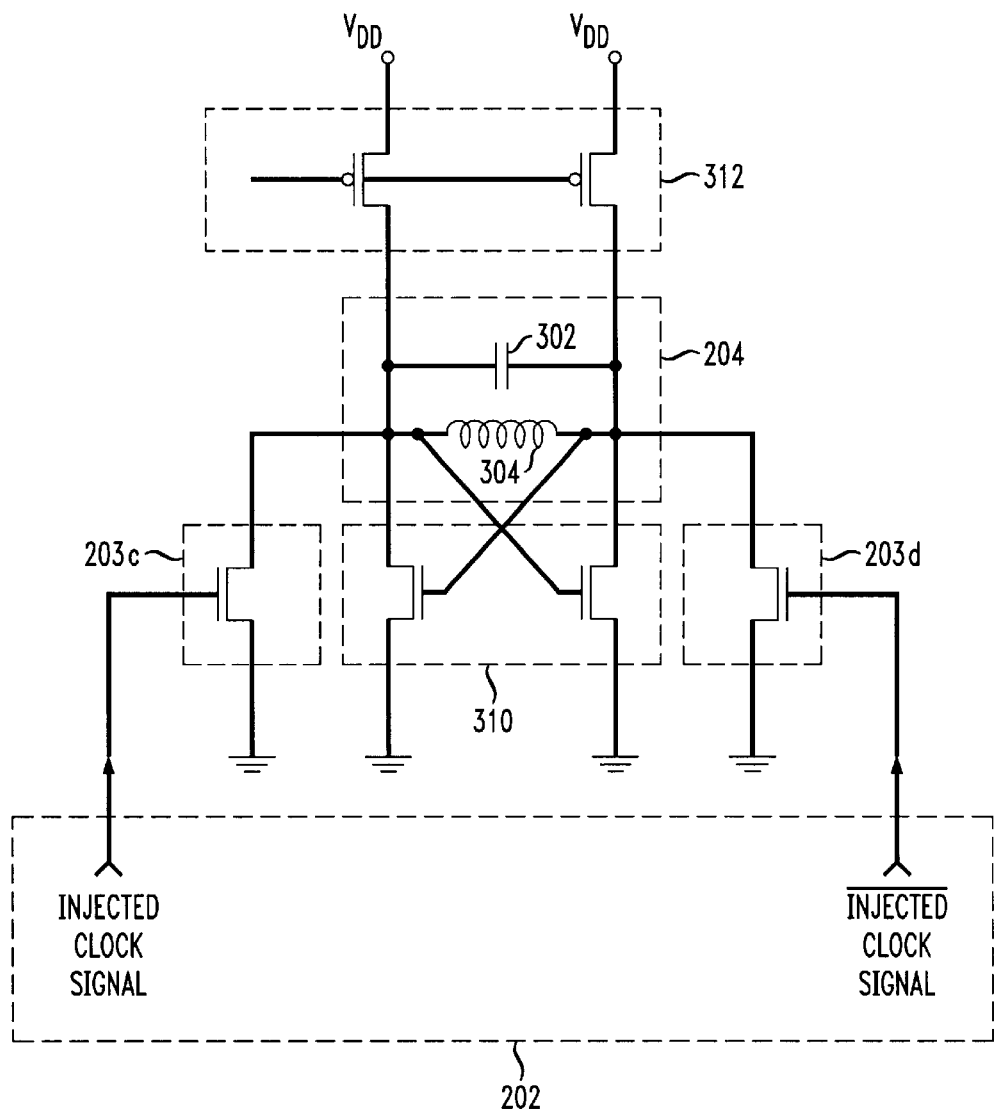
FIG. 6 shows the alternative use of transistors for impedance between the injected signal and the LC tank circuit oscillator, in accordance with the principles of the present invention.

The impedance 203 (FIG. 4) is provided by capacitors 203a, 203b in the present embodiment, as shown in FIG. 5. Alternatively, the impedance through which the tuning clock signal is injected could be, e.g., FET transistors 203c, 203d with gates connected to respective phases of the injected clock signal, e.g. an injected clock signal and an inversion or 180° phase-shifted injected clock signal, as shown in FIG. 6.

Figure 7:
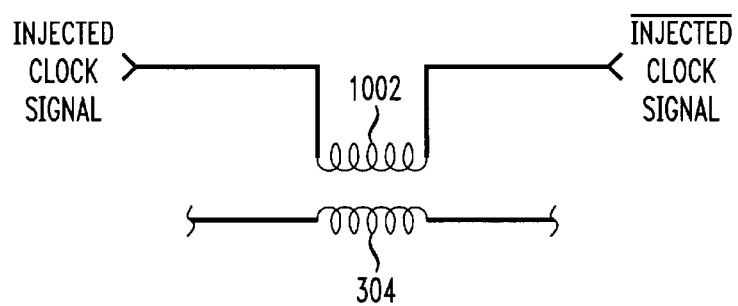
FIG. 7 shows another embodiment of the present invention utilizing inductive coupling to inject a locking frequency signal into the inductor of an LC tank circuit oscillator.

FIG. 7 shows another embodiment of the present invention utilizing inductive coupling to inject a locking frequency signal into the inductor 304 of the LC tank circuit 204.

In particular, FIG. 7 shows that a frequency adjustment of the LC tank circuit oscillator can be achieved by injecting a tuning signal into the LC tank circuit using an inductive element 1002, e.g., a coiled wiring formation forming an inductance. The inductive element 1002 is located sufficiently adjacent the inductor 304 of the LC tank circuit for the inductive element 1002 to cause an induced signal in the LC tank circuit oscillator 204. The impedance between the injection signal and the LC tank circuit oscillator would in this embodiment be formed by a metallic core, air and/or an insulative medium.

Figure 8:
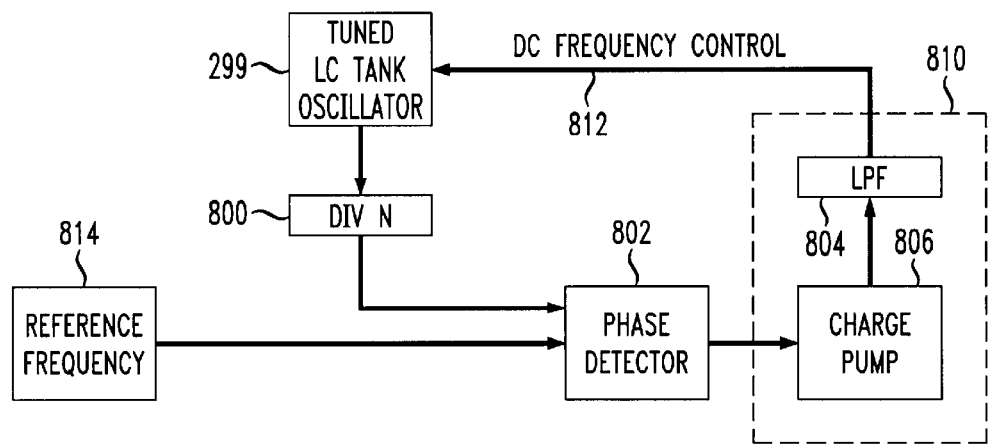
FIG. 8 shows a block diagram of an LC tank circuit oscillator having a nominal frequency tuned by the output of a PLL.

FIG. 8 shows a block diagram of an injected (i.e., tuned) LC tank circuit oscillator 299, e.g., as shown in FIG. 4, but including a varactor or other voltage-controlled adjustable element such that a DC control signal 812 can adjust a nominal frequency of the LC tank circuit oscillator 204. The DC control signal 812 in the embodiment shown in FIG. 8 is provided by a PLL comprising a frequency divider 800, a phase detector 802, and a frequency-to-voltage converter 810.

In particular, the phase detector 802 compares a representation of the tuned frequency of the LC tank circuit oscillator 299, e.g., divided by a frequency divider 800 for convenience, with a reference frequency 814, and outputs a phase differential to a frequency-to-voltage converter 810. The frequency-to-voltage converter 810 includes a charge pump 806 for building up a charge corresponding to the amount of phase differential output by the phase detector 802, and a low pass filter 804 for providing a clean voltage signal corresponding to an amount of change required in the nominal frequency of the tuned LC tank circuit oscillator 299.

Although the tuned LC tank circuit oscillator 299 does not require a PLL for operation, the use of a PLL in conjunction with an injected signal can provide optimum oscillation control and accuracy.

Figure 9:
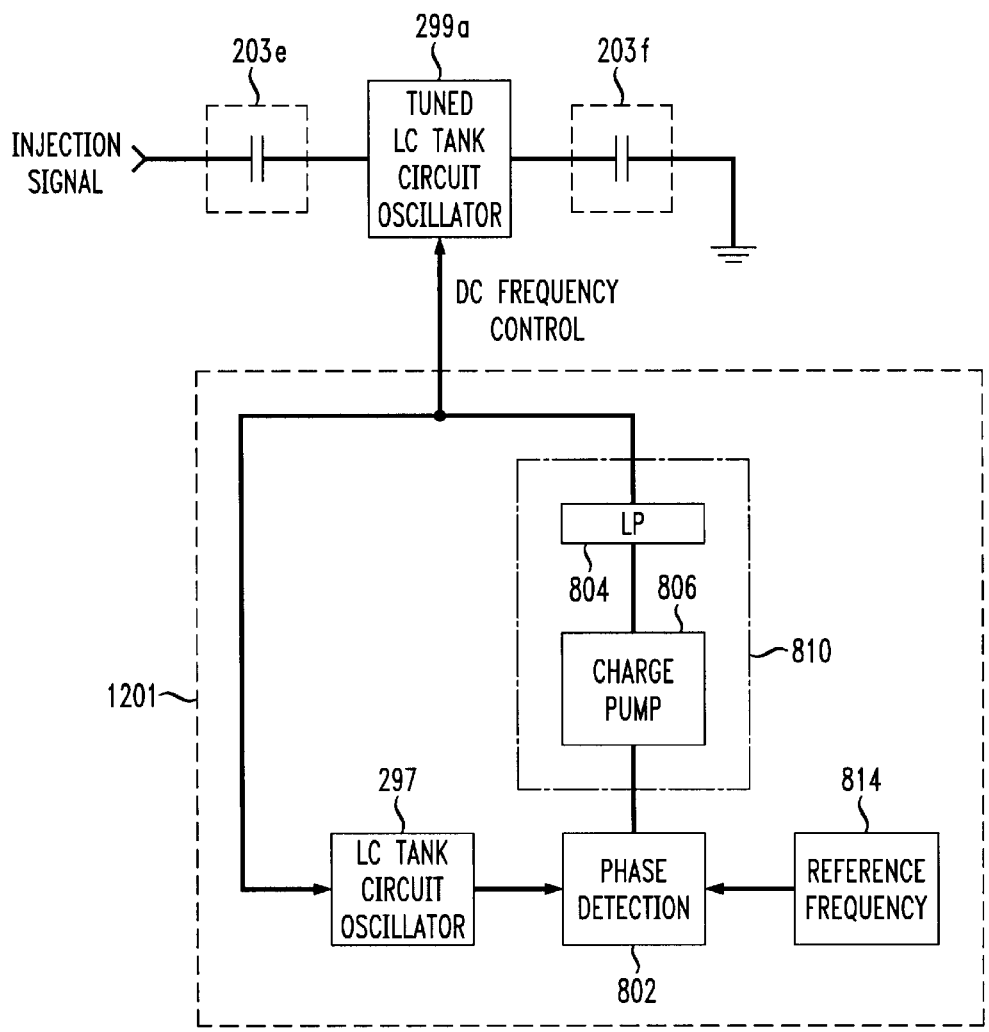
FIG. 9 shows the use of one LC tank circuit oscillator in a closed-loop PLL to control the nominal operating frequency of an open-loop LC tank circuit oscillator.

FIG. 9 shows the use of a DC frequency control signal generated in a closed-loop oscillator system 1201 including a PLL to control a varactor or other voltage-controlled adjustable component in a tuned LC tank circuit oscillator 299*a*.

In particular, FIG. 9 shows an untuned LC tank circuit oscillator 297 controlled by a PLL including a reference frequency 814, phase detector 802, and frequency-to-voltage converter 810 as described with respect to FIG. 8. However, because of possible instability caused by injecting a tuning signal into a closed-loop oscillating system, it is preferred to inject a tuning signal into an open-loop LC tank circuit oscillator 299*a* as shown in FIG. 9. Thus, only the open-loop LC tank circuit oscillator 299*a* is tuned with an injection signal. Except for the injection of the tuning signal, the LC tank circuit oscillators 297 and 299*a* may be the same. In FIG. 9, the injection signal is injected single-ended into the LC tank circuit oscillator 299*a*. Of course, the injection signal could also be inverted and applied to the second node of the LC tank circuit oscillator 299*a* within the principles of the present invention.

Figure 10:
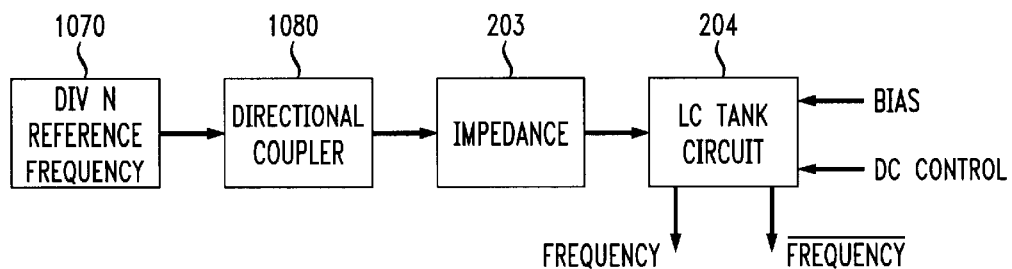
FIG. 10 shows the injection of a divided reference signal.

FIG. 10 shows that the injection signal may be a reference signal which may be divided in a divider 1070. The divider 1070 may divide the injection signal by any value greater than or equal to 1.

FIG. 10 also shows that a directional coupler 1080 may be used to provide reverse-direction isolation between the injection signal from the divider 1070 and the LC tank circuit oscillator 204. For instance, a return signal flow from the LC tank circuit oscillator 204 back to the injection signal source may be reduced by as much as 10 to 60 decibels (dB) or more in the directional coupler 1080.

Figure 11:
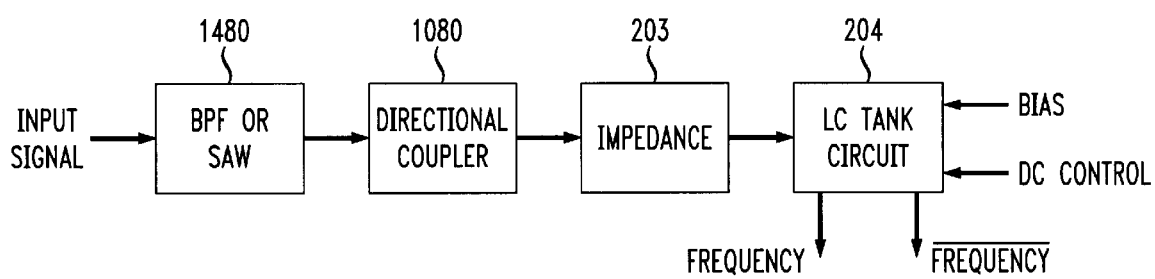
FIG. 11 shows the use of a band pass filter or SAW filter to isolate a desired tuning injection signal.

FIG. 11 shows that the input injection signal may be filtered by a band pass filter (BPF) or saw filter 1480 to, e.g., isolate a fundamental or harmonic frequency for injection into the LC tank circuit oscillator 204.

Figure 12:
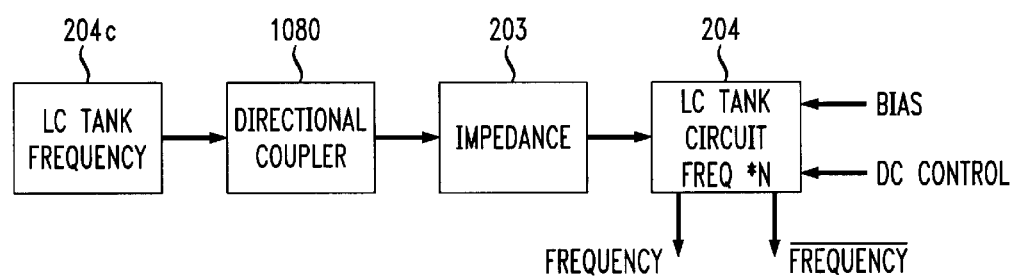
FIG. 12 shows the use of a separate LC tank circuit oscillator to provide an injection signal for tuning a higher frequency second LC tank circuit oscillator.

FIG. 12 shows the use of a separate LC tank circuit oscillator 204*c* to generate the injection signal for tuning a higher frequency second LC tank circuit oscillator 204. In this disclosed embodiment, the tuned second LC tank circuit oscillator 204 can provide a multiplication N of the frequency of the first LC tank circuit oscillator 204*c*, where N≧1.

Figure 13:
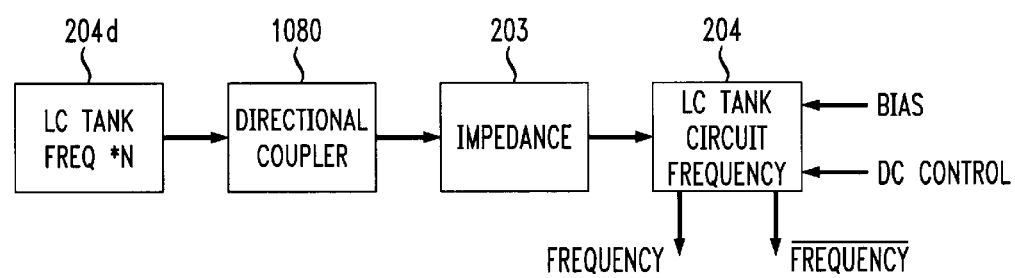
FIG. 13 shows the opposite of FIG. 12, i.e., the provision of a divided frequency from a second, tuned LC tank circuit oscillator with an injection signal provided by a separate LC tank circuit oscillator.

FIG. 13 shows the opposite of the embodiment of FIG. 12, i.e., the provision of a divided frequency from a second, tuned LC tank circuit oscillator 204 with an injection signal provided by a separate LC tank circuit oscillator 204*d* running at a multiple N of the desired divided frequency, where N≧1.

Figure 14:
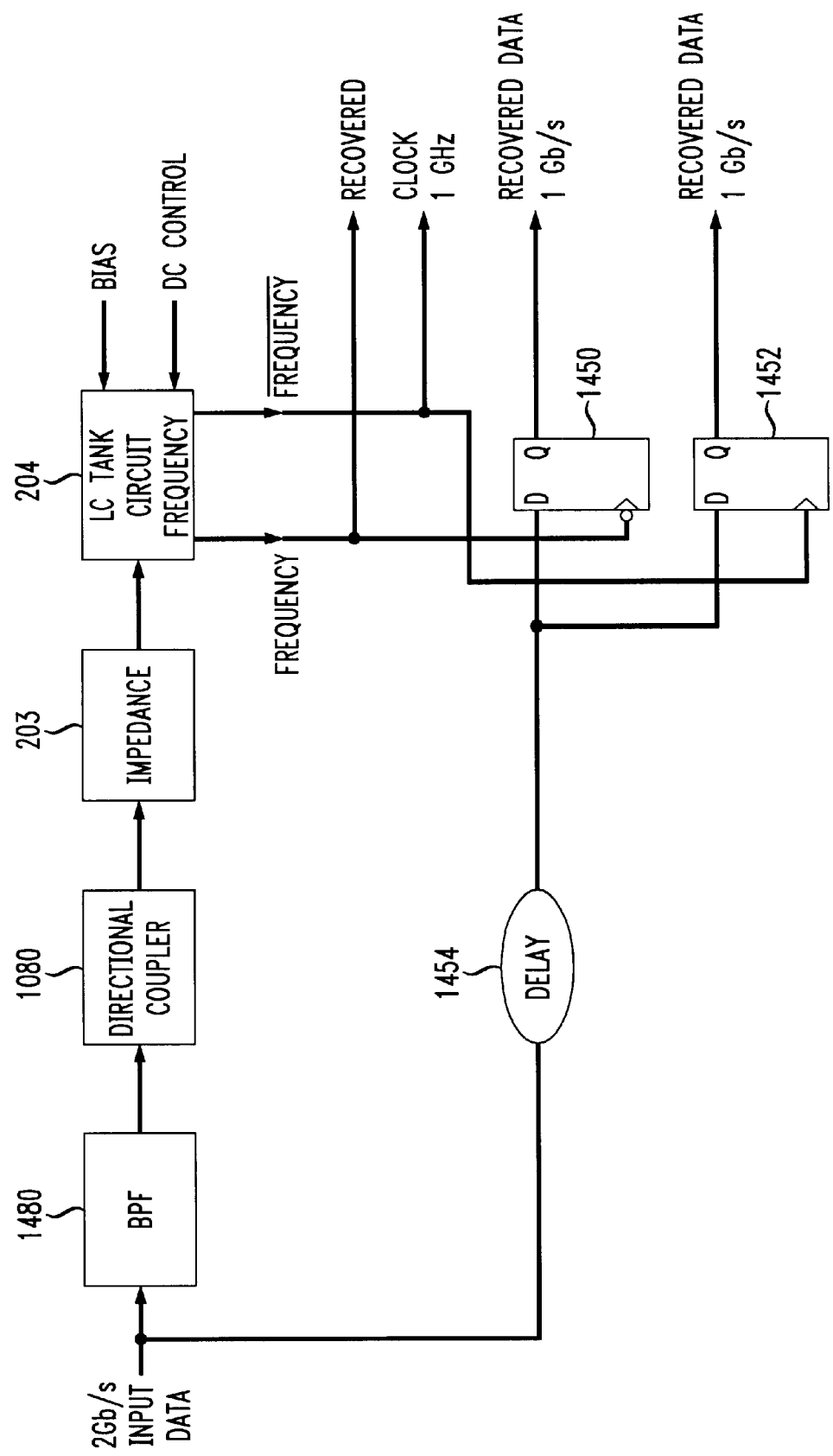
FIG. 14 shows a specific application of the embodiment shown in FIG. 11 used to recover clock and data signals from an input data stream.

FIG. 14 shows a specific application of the embodiment shown in FIG. 11 which can be used to recover clock and data signals from an input data stream.

In particular, a data stream, e.g., a 2 gigabit per second (Gb/s) data stream is input to a band pass filter 1480 for determination of a data clock. The data clock is injected into the LC tank circuit oscillator 204, which outputs stable data clock signals Freq and /Freq. The data clock signals Freq and /Freq are used to latch data in the input data stream using, e.g., Flip-Flops 1450 and/or 1452. A delay 1454 may be necessary in the data recovery path to compensate for the delays in the band pass filter 1480, directional coupler 1080, impedance 203, and/or LC tank circuit oscillator 204. The BPF 1480 and directional coupler 1080 are not always needed. The system requirements will dictate their need.

Figure 15:
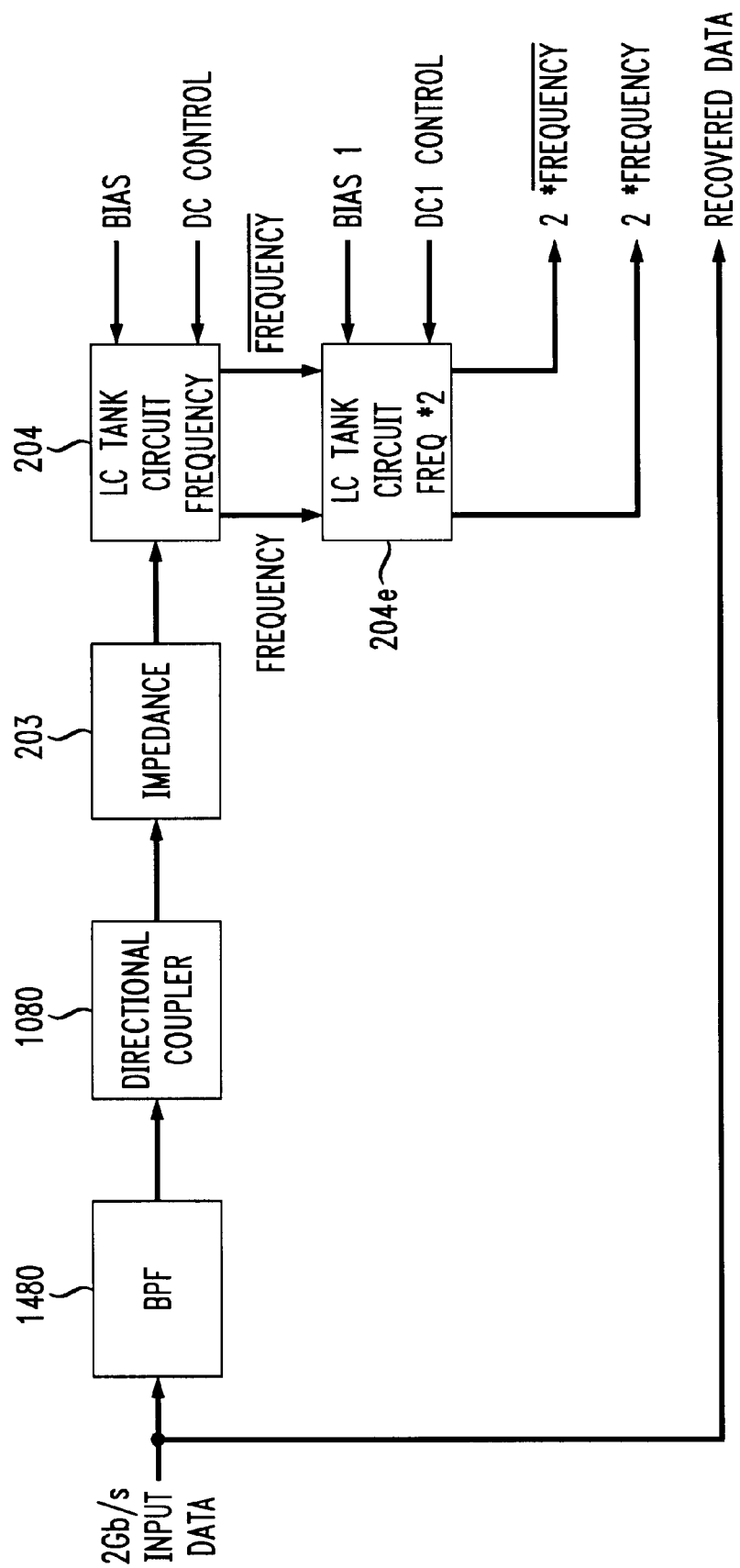
FIG. 15 shows a variation of the embodiment shown in FIG. 14 wherein a second LC tank circuit oscillator is used to provide a stable multiple of the data clock.

FIG. 15 shows a variation of the embodiment shown in FIG. 14 wherein a second LC tank circuit oscillator 204*e* is used to provide a stable multiple of the data clock, e.g., two times the data clock signals 2*Freq and 2*/Freq. In this embodiment, the first LC tank circuit oscillator 204 is used to injection lock the second LC tank circuit oscillator 204*e*. It is also possible to injection lock the second LC tank circuit directly, thereby, removing the need of the first LC tank circuit 204.

It is possible to introduce more than one reactive or resistive injection signal into the LC tank circuit in accordance with the principles of the present invention.

Figure 16A:
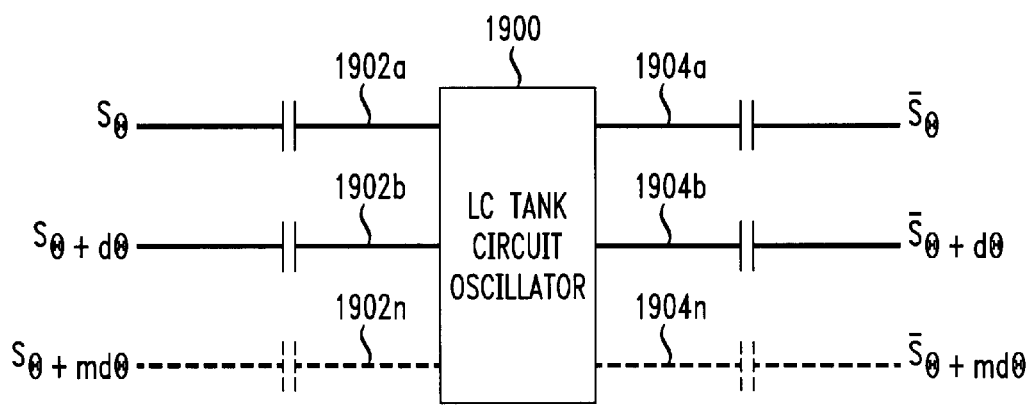
FIG. 16A shows an LC tank circuit oscillator having a plurality of input injection signals at one or more nodes thereof.
Figure 16B:
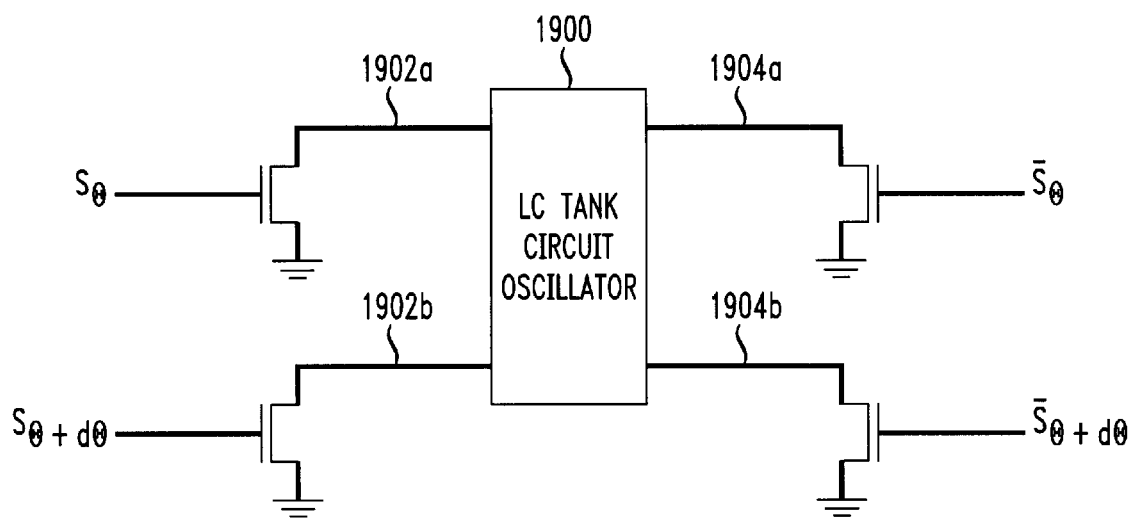
FIG. 16B shows the applicability of other forms of impedance, i.e., FET or bipolar transistors, to the principles of the present invention.

A plurality of injection signals may tune the LC tank circuit as shown in FIGS. 16A and 16B. In particular, FIG. 16A shows an LC tank circuit oscillator 1900 having a plurality of signals 1902*a*, 1902*b*, 1902*n* input to a first node thereof, and a plurality of signals 1904*a*, 1904*b*, 1904*n* input to a second node thereof. Each of the signals 1902*a*, 1902*b* and 1902*n* are out of phase with one another by, e.g., a multiple of an incremental phase differential dθ, as are the complementary signals 1904*a*, 1904*b* and 1904*n*.

The embodiment of FIG. 16A shows capacitive injection locking of the LC tank circuit. However, the invention is equally applicable to the use of transistor devices such as MOSFET (FIG. 16B) or bipolar transistors or inductive devices to inject a frequency locking signal into an LC tank circuit oscillator.

Figure 17:
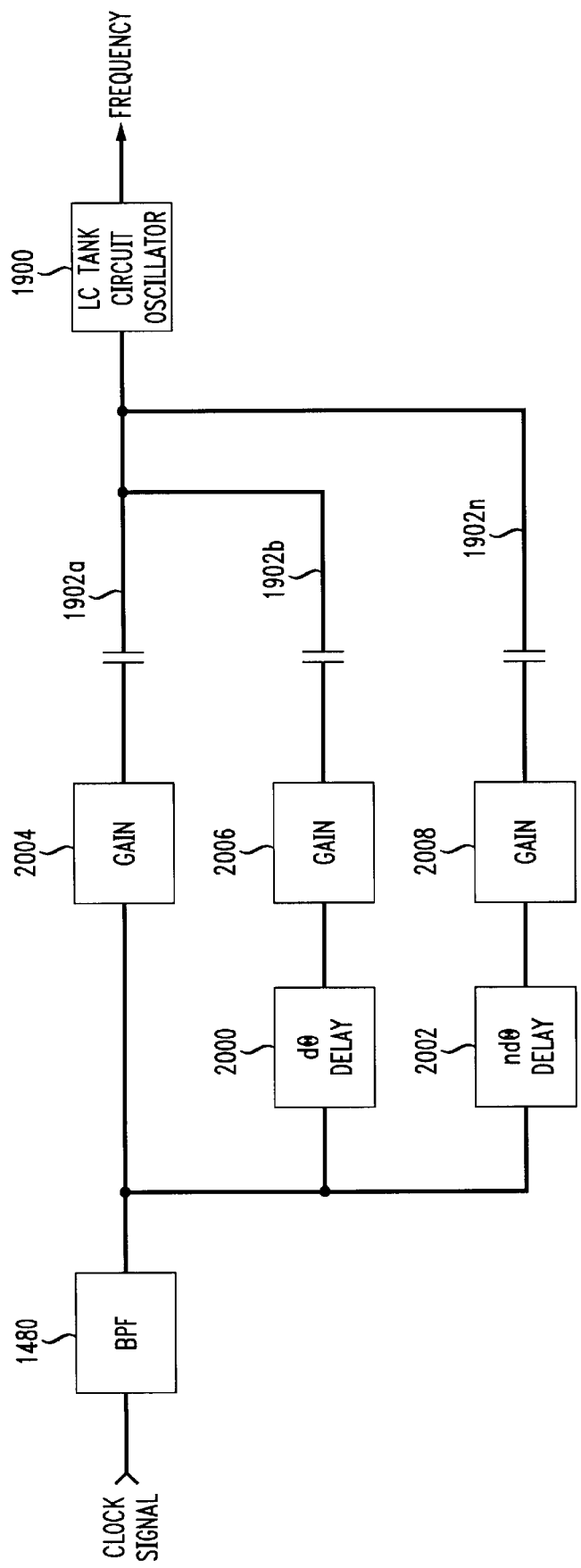
FIG. 17 is a block diagram showing the generation of a plurality of phase shifted injection signals shown in FIGS. 16A and 16B.

FIG. 17 is a block diagram of a circuit for generating the plurality of phase shifted injection signals shown in FIGS. 16A and 16B.

In particular, FIG. 17 illustrates the use of delay elements 2000, 2002 having a time delay selected based on the desired amount of phase shift and the desired injection frequency. As shown in FIG. 17, a recovered clock signal is band pass filtered in a band pass filter 1480 and presented to a plurality of signal paths 1902*a*, 1902*b* and 1902*n*. In the first signal path 1902*a*, the signal is amplified in a gain stage 2004 and capacitively injected into the LC tank circuit oscillator 1900. In the second signal path 1902*b*, the signal is delayed to provide a phase shift of dθ, amplified by a gain stage 2006, and capacitively injected into the LC tank circuit 1900. Similarly, in the nth signal path, the signal is phase shifted by an amount of time corresponding to ndθ, amplified in gain stage 2008, and capacitively injected into the LC tank circuit 1900.

The principles of the present invention can be used to phase lock a quadrature oscillator.

Figure 18:
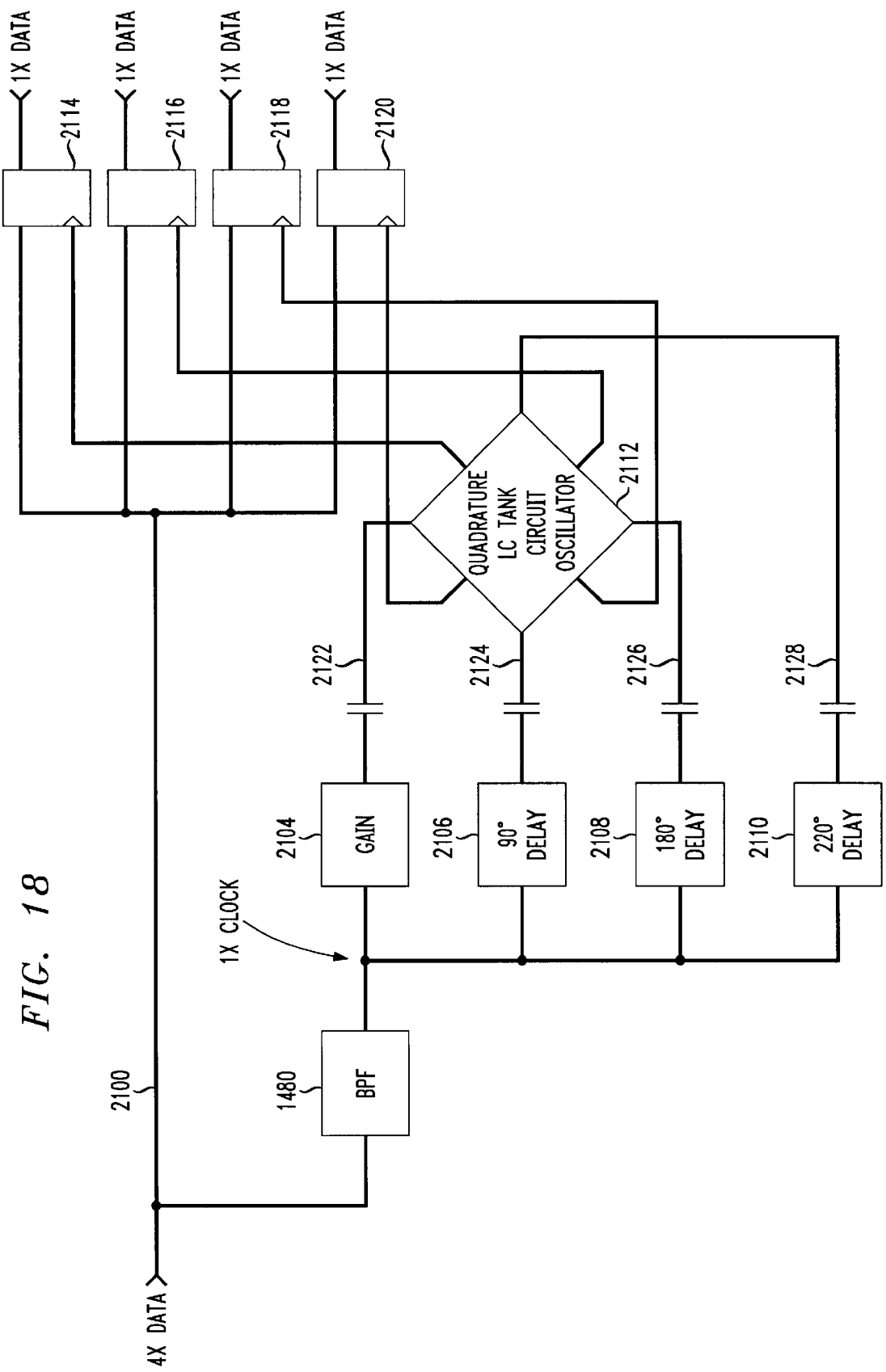
FIG. 18 shows the applicability of the present invention to the injection of tuning signals into oscillators having more than two nodes.

For instance, FIG. 18 shows an input clock signal 2100 at a rate four times the data input to a bandpass filter 1480. The injection locking signal output from the bandpass filter 1480 is presented directly to the quadrature oscillator 2112 through a first signal path 2122. The injection locking signal is also presented to a second node of the quadrature oscillator 2112 through a second signal path 2124 after a 90° phase delay in a phase delay element 2106. Similarly, the injection locking signal is presented to a third node of the quadrature oscillator 2112 through a third signal path 2126 after a 180° phase delay in phase delay element 2108, and is presented to a fourth node of the quadrature oscillator 2112 through a fourth signal path 2128 after a 270° phase delay in phase delay element 2110. The respective 1× data clock signals are output from flip-flop circuits 2114–2120.

Gain stages, e.g., as shown in the embodiments of FIGS. 17 and 18, may not be necessary in the particular application. Nor is the BPF 1480 necessarily required. These are both conditions of the system requirements.

Although the embodiment of FIGS. 16A, 16B, 17 and 18 show differential injection locking signals input to the LC tank circuit, a plurality of single-ended injection locking signals may be input to only one node of the LC tank circuit 1900 in accordance with the principles of the present invention.

The inductor and/or capacitor utilized in the LC tank circuit oscillator 204 may be formed in an integrated circuit or may be discrete components, depending upon the particular application.

Accordingly, operation of the LC tank circuit in accordance with the principles of the present invention can form the basis for a stable clock generator for use by other components. Moreover, as integrated circuit technology progresses to more efficient technologies, the LC tank circuit may be injected at higher frequencies, and thus higher clock signals may be recovered, using injection tuning in accordance with the principles of the present invention.

For instance, as shown and described herein below, 0.25 μm CMOS technology can be used to implement a first clock recovery cell wherein a 3.25 Gb/s data signal is injected into an LC tank circuit to recover a 3.25 Gb/s data clock. Moreover, a second clock recovery cell can be formed wherein a 5.6 Gb/s clock signal is recovered using a clock recovery cell formed in a 0.25 μm CMOS integrated circuit.

3.25 Gb/s Injection Locked CMOS Clock Recovery Cell

Clock recovery has and will continue to be an important system design issue when data is being transferred between cells of a system. Particularly, for high speed Input/Output (I/O) interfaces, this issue is of a critical concern since package pin count is at a premium. Currently, Gigabit standards have appeared where clock recovery is utilized to extract the clock from the data stream.

One of the limitations of a conventional clock recovery cell has been the VCO (Voltage Control Oscillator) typically formed with an odd number (n) of inverters in a ring. These inverters must have a control signal to adjust the delay of each gate that in turn adjusts the frequency of operation. This requires at least one additional series device in the path between the supply and output node. A DC voltage can be applied to this additional device to control the propagation delay $t_d$. The propagation delay $t_d$ of each inverter is increased with each additional device and the overall cycle delay in an n stage ring oscillator determines the frequency, in this case $1/(2n*t_d)$. To reach the maximum frequency, either the number of inverters n or the propagation delay $t_d$ must be reduced. For a non-balanced ring oscillator, the minimum number of inverters (n) to sustain oscillations is three. For a balanced ring oscillator, n can be lower allowing a higher frequency. However, both of these terms limit the highest frequency attainable in a conventional VCO of a PLL (Phase Lock Loop) when ring oscillators formed by inverters are used in clock recovery circuits.

In accordance with the principles of the present invention, a clock recovery circuit can be formed by using a single CMOS LC tank circuit. This oscillator can have a clock period less than one conventional CMOS inverter delay and can overcome the previous mentioned frequency limitation.

Furthermore, depending on the architecture used, the coarse adjustment of the PLL can be completely removed from the functional behavior of an LC tank circuit when it is used as a clock recovery cell, as described in this paper.

One possible architecture segregates the data path from the control loop of the PLL by replication. The advantage of this architecture simplifies the design, improves the stability and improves performance. Overall, the basic clock recovery cell requires as little as four active transistors, a capacitor, and an inductor. When compared to conventional designs, the required overhead circuitry to extract the clock from the data is minimized in this new approach.

On chip inductance has played an important role in the generation of RF signals in silicon. Combining the energy storage capabilities of both the inductor and the capacitor, along with the negative resistance of the cross-coupled MOS structure has allowed high frequency oscillations to be generated using minimum power dissipation. The energy storage combination of the LC tank allows the performance to approach the operational limits of the CMOS technology.

Figure 19A:
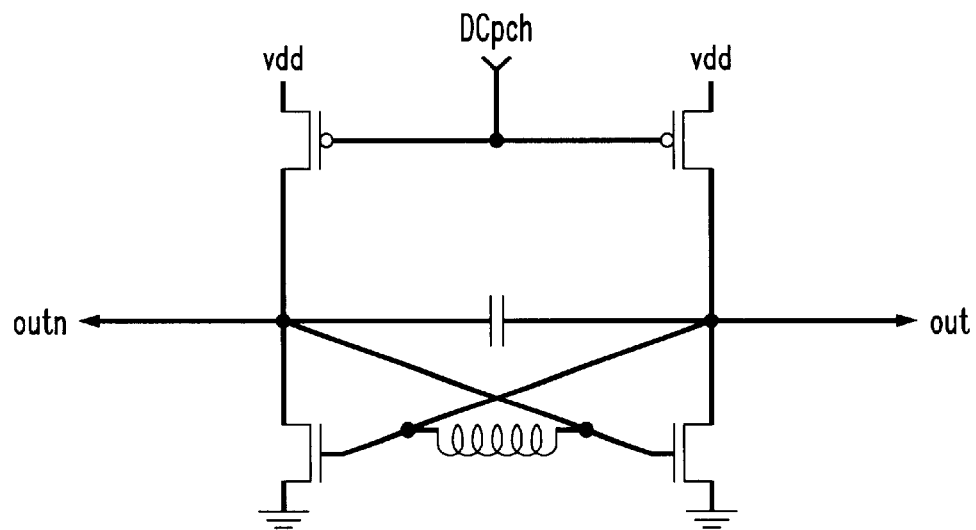
FIGS. 19a to 19c show various embodiments of an LC tank oscillator circuit.
Figure 19B:
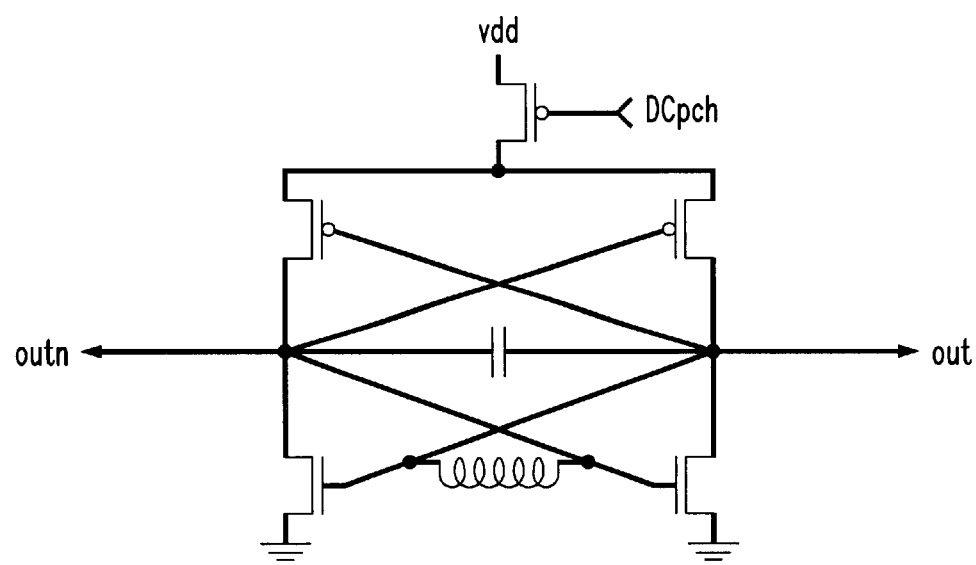
Figure 19C:
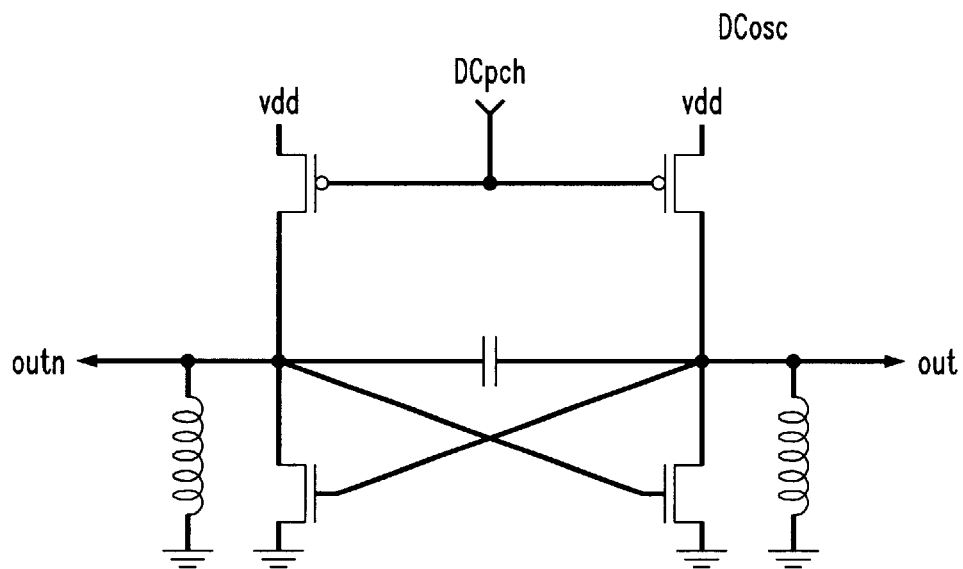
Figure 19D:
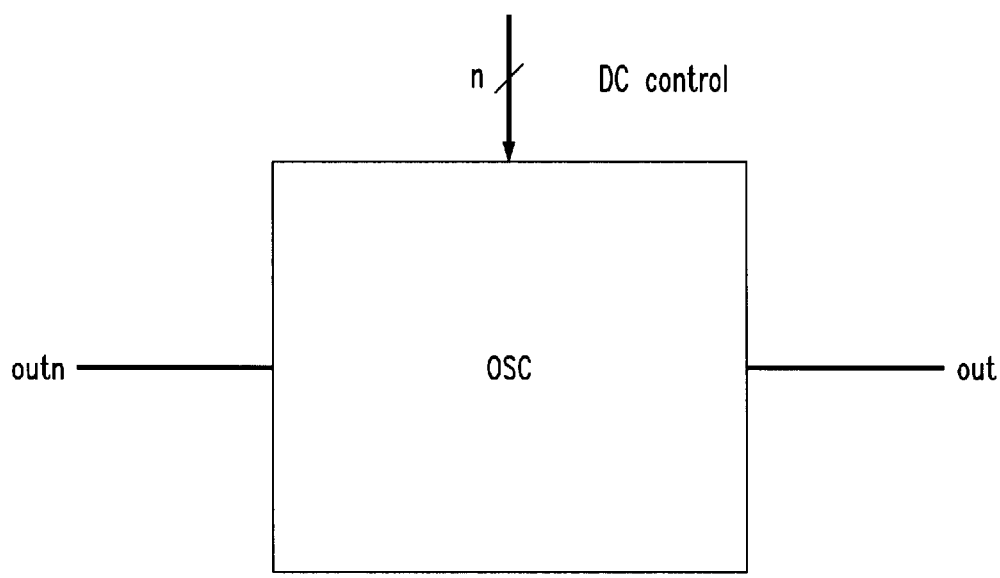
FIG. 19d shows an exemplary schematic symbol, suitable for use in a data recovery cell operating at 3.25 Gb/s, in accordance with a clock signal recovery application utilizing the principles of the present invention.

FIGS. 19*a* to 19*c* show circuit diagrams of three versions of an injection tuned CMOS LC oscillator constructed in accordance with the principles of the present invention, suitable for generating a balanced output, and FIG. 19*d* shows a schematic symbol for the injection tuned LC tank circuit.

In particular, in FIGS. 19*a* and 19*b*, a single inductor-capacitor is connected to either a single or double cross-coupled MOS structure. In FIG. 19*c*, two inductors are used. This cross-coupled circuit configuration allows MOS devices in conjunction with tank circuits in accordance with the principles of the present invention to operate at clock rates as high as 1 to 5 GHz.

Injection locking in oscillators is, in general, well documented and some authors have named this structure a synchronous oscillator (SO). In transmission systems, injection locking has been used to generate a local clock in the system, but has not hereto before been used to recover a clock signal, as in the present invention. Instead, these conventional systems typically used RZ (Return to Zero) data that inherently contains the clock signal in the PSD (Power Spectrum Density), and the energy of this clock signal is used to injection lock a tank circuit. The voltage difference between the regenerated clock and the incoming data signal is compared against a reference voltage level to extract the digital data.

With NRZ (Not Return to Zero) data, the edges of the 0–1 and 1–0 transitions are differentiated to generate positive and negative pules. These pulses are then applied to a full wave rectifier to generate a pulse stream to excite a tank circuit. This signal preprocessing is preferred before the incoming NRZ signal can be applied to a LC tank circuit to generate a synchronous clock.

Synchronous oscillators (SO) have also been used to extract small signal levels embedded in spectrums with a lower noise floor. For instance, information as small as −100 dBm has been extracted using a SO.

The theoretical PSD of a NRZ signal is a sinc squared function with nulls at the clock frequency. However, in practice, due to coupling, which is typically unintentional, a portion of the clock signal is carried in the data stream.

Figure 20A:
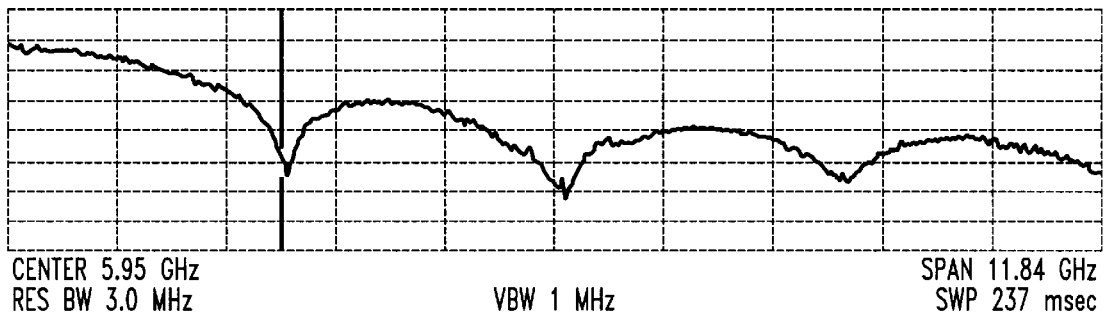
FIG. 20A shows a measured spectrum of 3 Gb/s NRZ data.
Figure 20B:
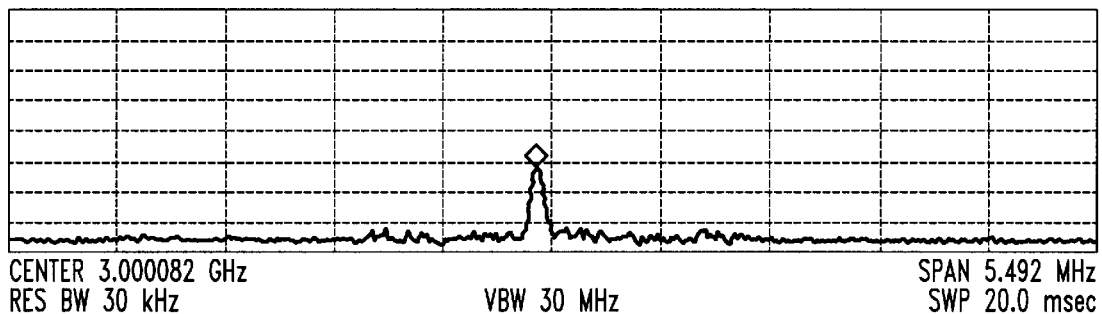
FIG. 20B shows an expansion of FIG. 20A at 3 GHz illustrating the inclusion of an embedded clock signal.

FIG. 20A illustrates the PSD of a NRZ 3 GB/s data stream and FIG. 20B shows an enlargement of the spectrum at 3 GHz. From theory, this region should be flat, however, a small amplitude clock signal of −50 dBm is visible at 3 GHz. This embedded clock signal occurs because of unavoidable coupling between the logic elements at the transmitter, which adds the clock signal to the data signal. This is illustrated in FIG. 20C.

Figure 20C:
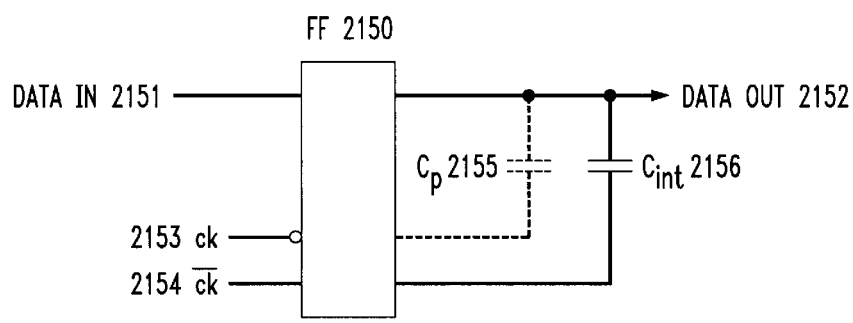
FIG. 20C shows the parasitic and intentional capacitance's.

In particular, in FIG. 20C, a flip-flop 2150 captures "data in" 2151 and generates "data out" 2152 when a CK signal 2153 and its compliment 2154 are applied to the flip flop 2150. However, due to parasitic coupling between traces, miller capacitance, layout crossovers between active and passive components, the signal energy from the clock signal can become embedded into the 'data out' signal 2152 by these parasitic elements. In particular, the capacitance $C_p$ 2155, where this capacitance is parasitic, plays the role of embedding the clock energy into the output 'data out' 2152 stream. (Inductive parasitic coupling can also play a role.) To enhance the coupling of the clock signal, one can add an intentional coupling element $C_{int}$ 2156 to increase the magnitude of this embedded clock signal. Thus, the magnitude of the embedded clock signal can be increased intentionally. Note that this causes the PSD of the NRZ data stream to approach the PSD of RZ (return to Zero). The PSD of RZ data has the same spectrum as that of the NRZ with the addition of impulse functions at the clock frequencies and multiples therein. Thus, RZ data would also be a useful data stream to injection lock an oscillator.

In accordance with the principles of the present invention, a tank circuit can be used to extract this embedded clock signal from an input data stream of NRZ digital bits, thereby eliminating the need to perform the pre-processing steps. Furthermore, this stimulus can be used to frequency lock and phase align an oscillator at the destination so that it behaves as a clock recovery unit. Since the LC tank circuit is a narrow bandpass filter, it can be tuned to extract this embedded clock signal.

Injection locking in CMOS LC tank circuits can be used to perform superharmonic frequency locking and quadrature oscillation generation. The first uses a stimulus that is a harmonic of the oscillator frequency to lock the oscillator. Both techniques preferably use an active MOS or BJT device to inject external signals into an injection tank circuit constructed in accordance with the principles of the present invention.

Figure 21:
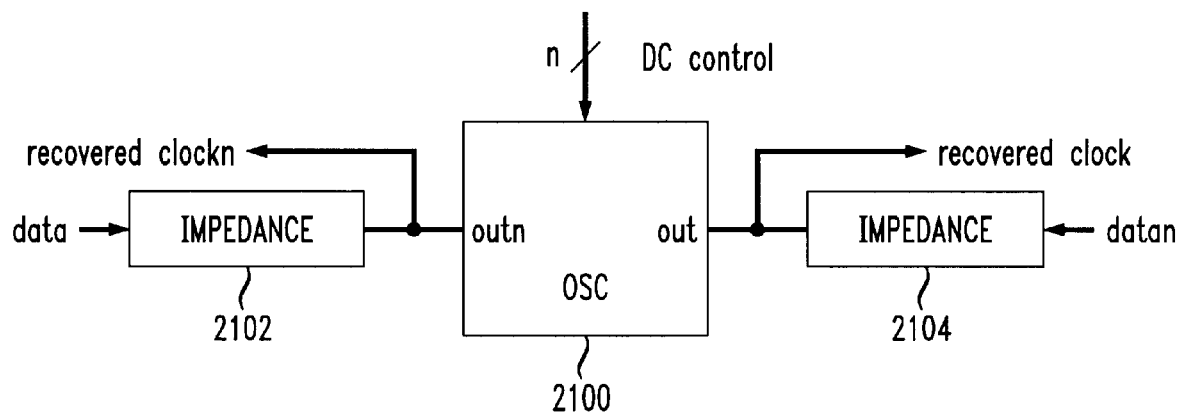
FIG. 21 is a block diagram of a basic embedded clock recovery cell using an injection tuned LC tank oscillator, in accordance with an aspect of the present invention.

A basic embedded clock recovery cell (CRC) used in the present 3.25 Gb/s clock recovery application is illustrated in FIG. 21.

In FIG. 21, a DC control signal is applied to an oscillator 2100 to perform a coarse frequency adjustment so that the free running frequency of the oscillator 2100 is within the locking range of the embedded clock signal. An impedance 2102, 2104 is used to inject this signal into the tank circuit. The input data signal consists of a NRZ pattern. The locking range of the oscillator 2100 preferably encompasses the clock frequency used to generate this NRZ pattern. The free running oscillator 2100 then locks to this clock frequency.

Once the oscillator 2100 is locked, it can be considered a slave to the input stimulus. At this point, the recovered clock signal at the output of the oscillator 2100 is phase and frequency locked to the input data. Thus, clock recovery can be achieved over a high speed range, e.g., over the range of 2.7 to 3.25 Gb/s with a $2^{31}-1$ pseudo-random data stream, even when measured over several devices and when operating conditions are varied.

All components can be integrated into one die, including the inductor of the LC tank circuit forming the oscillator 2100, in the disclosed CMOS embodiment.

A metal to metal (MTM) capacitor can be used in the formation of the capacitance, C, of the LC tank circuit. The layout of this capacitor is preferably carefully partitioned to insure that both sides of the inductor of the LC tank circuit has an equivalent capacitance between plates as well as from plate to ground. The DC control to the load devices in the LC tank circuit can vary the oscillation over a range of, e.g., 200 MHz.

Preferably, the I/O ports of the die forming the clock recovery cell are laid out in a balanced configuration, so that, e.g., a set of inputs and outputs are available on each side of the die. Preferably, an on-chip adjustable 50ω resistance terminates both data inputs.

In the disclosed embodiment, the inductance is, e.g., a 1 nH inductor with a trace width of 24 µm and a separation of 6 µm.

For signals in the GHz regime, the interconnect can be treated as transmission lines. In order to properly terminate these lines, and insure that reflections are kept to a minimum, the end of the line is preferably terminated in its characteristic impedance.

Discrete resistors take up valuable board space while on-chip resistors are prone to processing variance tolerances. An active-passive resistance combination is preferably utilized to insure accurate termination impedance. For instance, the previous active-passive configuration can be modified to allow for a continuous linear operation when the primary input NRZ data swings between 0.5 to 2 volts above ground.

Figure 22:
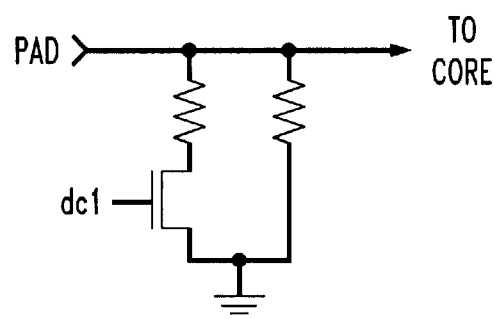
FIG. 22 shows an exemplary terminating impedance circuit.

An exemplary terminating impedance circuit 2200 is illustrated in FIG. 22.

In FIG. 22, the terminating impedance circuit 2200 includes an MOS device in series with a poly resistance which is then in parallel with a second poly resistance. A DC voltage dc1 is applied to the MOS device to smoothly vary the impedance near the characteristic impedance of the line.

In testing, the pull-in frequency locking range of this embodiment is 10 MHz for $2^7-1$ data. The pull-in frequency locking range reduces, e.g., to 3 MHz for, e.g., $2^{31}-1$ data. Moreover, a recovered clock signal frequency and phase locked to a $2^{31}-1$ pseudo random NRZ data pattern has been tested to have rms and peak to peak values of jitter of 4.1 and 25 psec, respectively.

It is preferable that the clock recovery system be designed so that the magnitude of the embedded clock signal can increased at least 10 dB above the on-chip noise floor levels within the bandpass, either by careful isolation (SOI, etc.), and/or by increasing the energy level of the clock signal. Another mechanism to control noise injection between multiple injection locked oscillators on the same die would be to coarse tune each oscillator to slightly different frequency. This would insure that once each oscillator is locked, the signal the oscillator generates would not influence the operation of the other oscillators. This isolation would be possible since the narrow bandpass tuning of each oscillator do not superimpose over one another.

Thus, an injection locked LC tank circuit has been disclosed which can perform clock recovery on NRZ pseudo random data. The insertion of the clock signal into the data stream is used to injection lock a CMOS LC tank circuit. The tank circuit is phase and frequency locked to this embedded clock input signal. In the disclosed embodiments, clock extraction has been measured at 2.7 to 3.25 GHz on $2^{31}-1$ pseudo random data using conventional 0.25 µm CMOS technology, with measured rms jitter of 4.1 psec.

5.6 Gb/s Clock and Data Recovery Cell

Clock and data recovery (CDR) techniques reduce interconnect concerns when data is transported between two locations of a system. However, as the bit rates continue to increase, the ability to extract the clock from the data becomes more demanding, particularly for CMOS technology. Currently, several Gigabit standards have appeared where clock recovery is utilized to extract the clock from the data stream.

An extremely high speed CDR cell can be formed in accordance with the principles of the present invention by using a CMOS LC tank circuit and clocked storage elements. The LC oscillator can have a clock period less than one conventional CMOS inverter delay, thus offering a path for high performance. Additional features of this extremely high speed clock recovery cell (e.g., 5.6 Gb/s) include the generation a balanced clock signal to clock storage elements, and the ability to injection lock this circuit using a NRZ data signal.

Figure 23A:
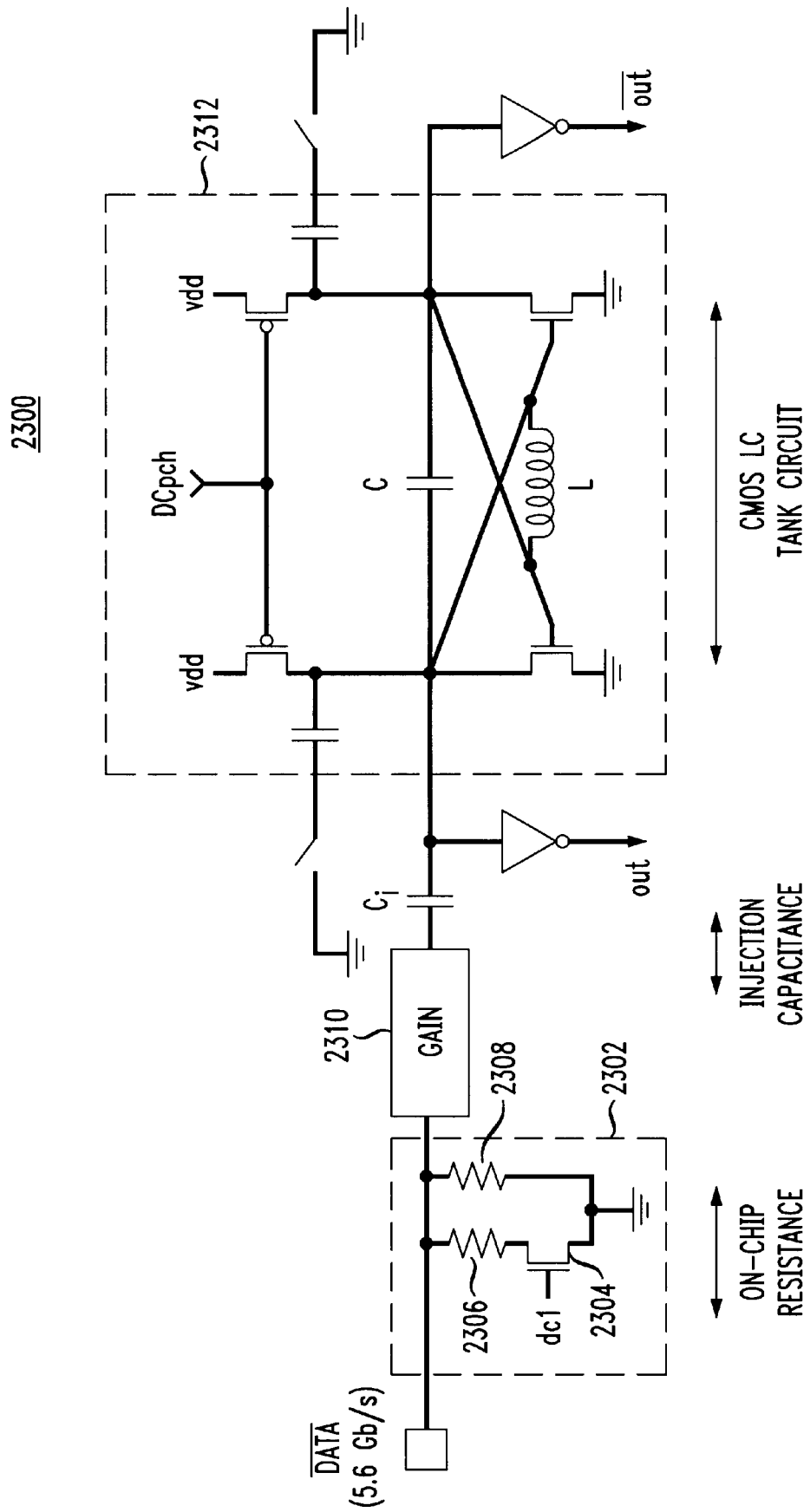
FIG. 23A illustrates an extremely high speed clock and data recovery cell using an injection tuned CMOS LC tank circuit constructed in accordance with the principles of the present invention.

FIG. 23A illustrates the extremely high speed clock and data recovery cell based on an injection tuned CMOS LC tank circuit 2300, in accordance with the principles of the present invention.

In particular, in FIG. 23A, a 'data in' signal comprises, e.g., a 5.6 Gb/s NRZ pattern. An on-chip adjustable resistance 2302 terminates this input signal with the characteristic impedance of the transmission line to a level preferably better than +/−2%. The adjustable resistance 2302 comprises an MOS device 2304 in series with a poly resistance 2306, which is then in parallel with a second poly resistance 2308.

A gain stage 2310 then applies this input signal to an injection capacitor $C_i$ which injects the input signal (e.g., a NRZ signal) into an injection tuned CMOS LC tank circuit 2312. This gain stage as mentioned earlier, may not be required based on system considerations. A second injection capacitor to the balanced output is not shown.

Since the injection tuned tank circuit 2312 forms a narrow bandpass filter, this circuit can be tuned to extract a narrow spectral component of the input signal. The power spectrum density of a NRZ is a sinc squared function. Thus, at 2.8 GHz, an NRZ pattern would contain an energy component which is instantaneously dependent on the input bit pattern. This can be seen by referring to FIG. 23B.

Figure 23B:
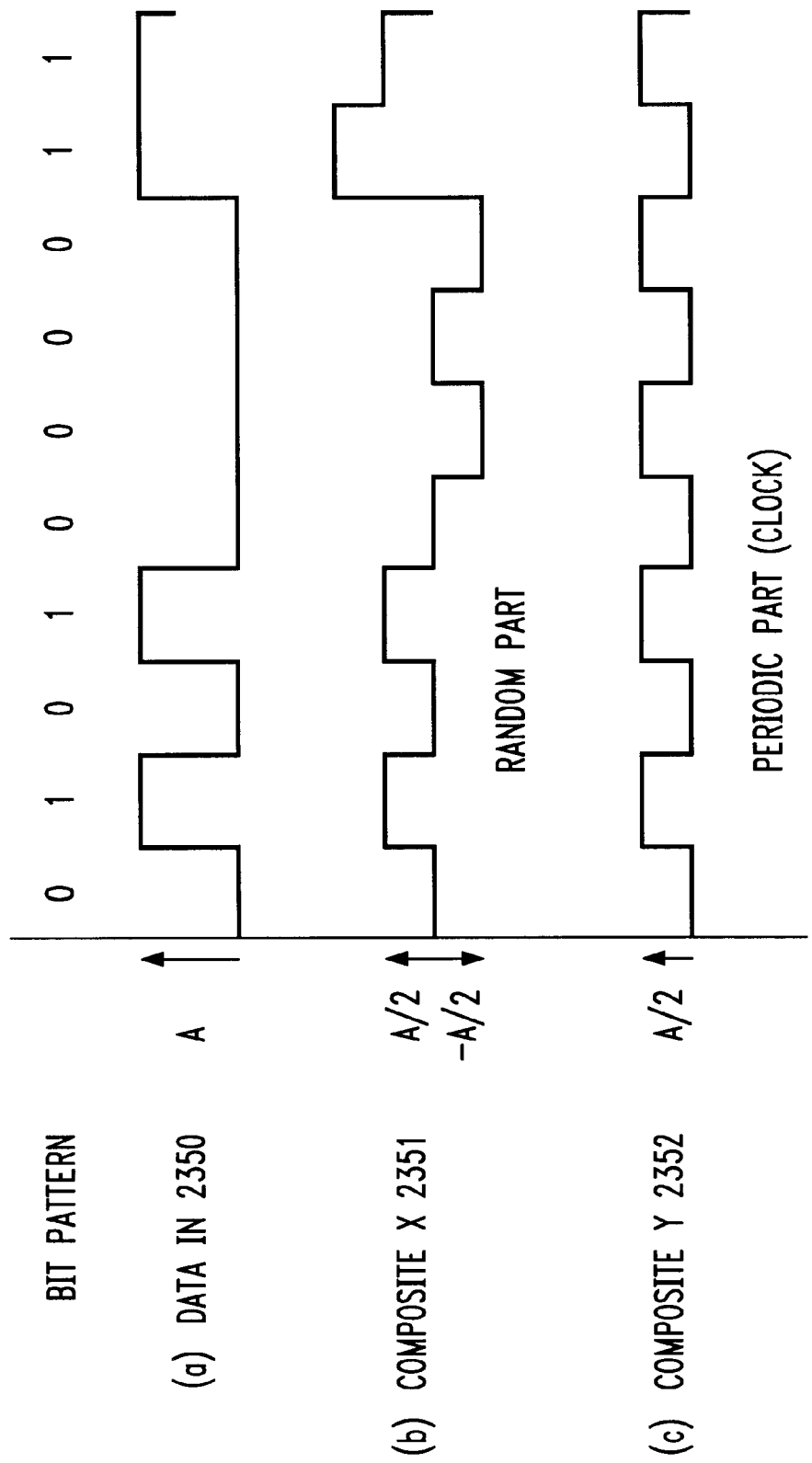
FIG. 23B shows the decomposition of a NRZ waveform.

In particular, in FIG. 23B, an 'input data' NRZ bit steam 2350 is shown which contains a 0101000011 pattern. This waveform can be decomposed into two composite waveforms, one containing the random component 2351 and a second containing the periodic component signal 2352. The two waveforms 2351 and 2352 can be added together to generate 2350. Note that the periodic component 2352 is a clock signal which is running at a frequency rate (Hz) that is half the bit rate of the input data signal 2350. In other words, if 2350 is at 5.6 Gb/s, the periodic signal 2352 would have a clock frequency of 2.8 GHz. However, as the bit pattern varies to contain a large number of consecutive 1's or 0's, the instantaneous clock energy would decrease. Once again, the technique of injecting a clock signal at the transmitter may be used to increase the amplitude of the clock signal.

The free running frequency of the injection tuned oscillator 2312 is set to the first sub-harmonic of the input signal, e.g., the input 5.6 Gb/s data (2.8 GHz) by coarse adjustment of the switched MOS capacitors or by adjusting the DC control voltage signal DCpch.

The DC control voltage signal DCpch in the tank circuit can vary the oscillation over a range of, e.g., 200 MHz. The free running injection tuned oscillator 2312 locks to this component in the NRZ signal. Once the injection tuned oscillator 2312 is locked, it can be considered a slave to this input stimulus. At this point, the full swing CMOS recovered clock signals out, outn at the output of the oscillator are phase and frequency locked to the input data.

Measurements of an injection locked circuit constructed in accordance with the principles of the present invention and operating at 3.12 GHz indicated an rms and peak to peak values of jitter of 4.1 and 25 psec, respectively.

Figure 24:
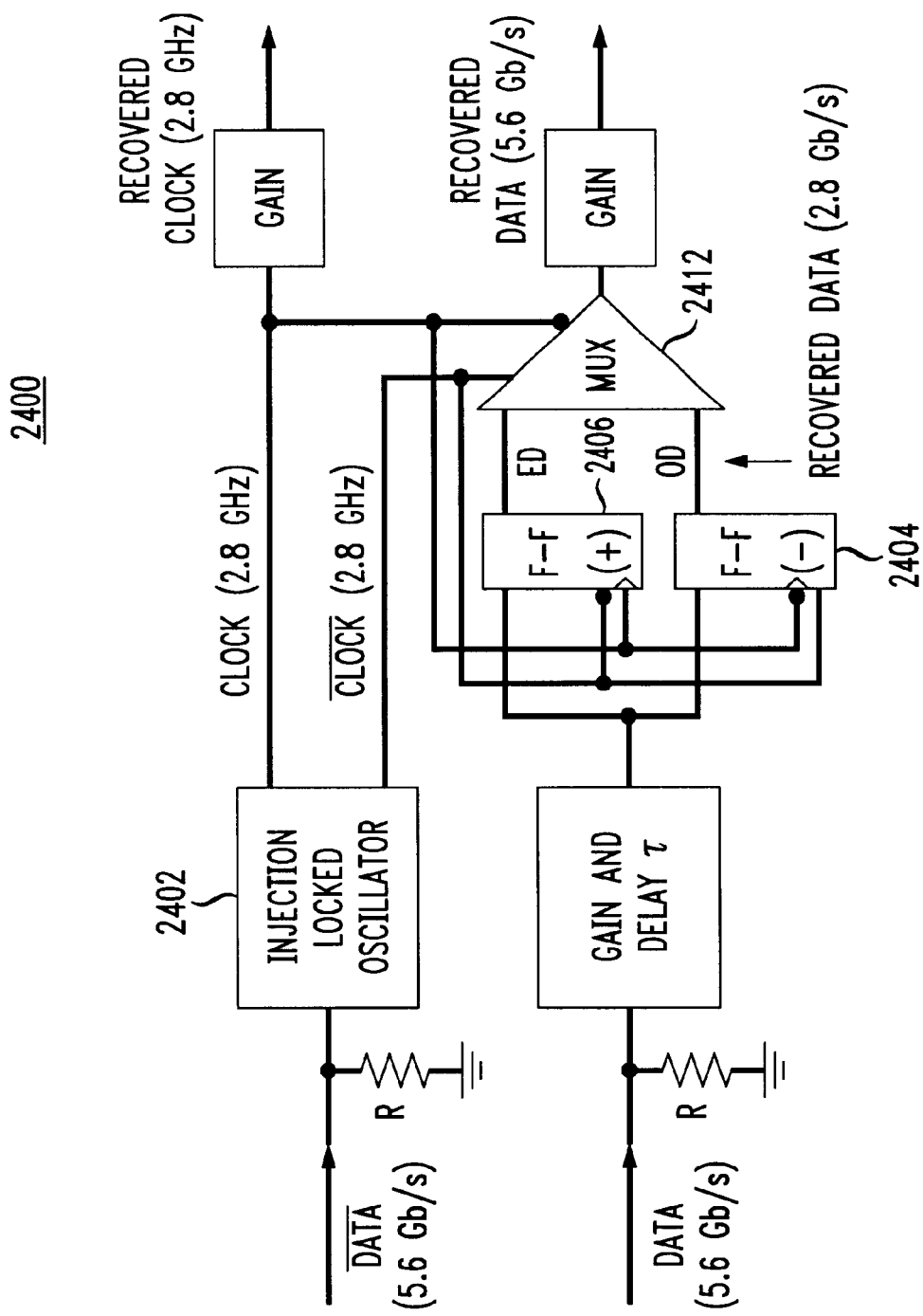
FIG. 24 illustrates a basic clock data recovery cell for extremely high speed signals, in accordance with the principles of the present invention.

A basic CDR cell 2400 for use at extremely high speeds such as 5.6 Gb/s is illustrated in FIG. 24.

In particular, in FIG. 24, the previously described on-chip adjustable 50ω resistance R terminates both 5.6 Gb/s input signals (i.e., data and datan). One input signal (e.g., datan) is used to injection lock the injection tuned oscillator 2402 to 2.8 GHz, providing a clock signal (e.g., 2.8 GHz) and its compliment signal to the data path portion of the CDR cell 2400. The second input signal (e.g., data) is applied simultaneously to a negative edge triggered Flip-Flop (FF) 2404 and to a positive edge triggered FF 2406.

Thus, the 2.8 GHz clock signal samples the input 5.6 Gb/s data signal twice a cycle. At this point, the 5.6 Gb/s input data signal has been used to generate a 2.8 GHz clock signal and two 2.8 Gb/s data signals ED and OD.

The CDR cell 2400 at this point is complete. However, due to a probe card limitation, a 2-to-1 mux 2412 may be used to interleave the even and odd data signals back into a single bit stream running at 5.6 Gb/s.

Figure 25:
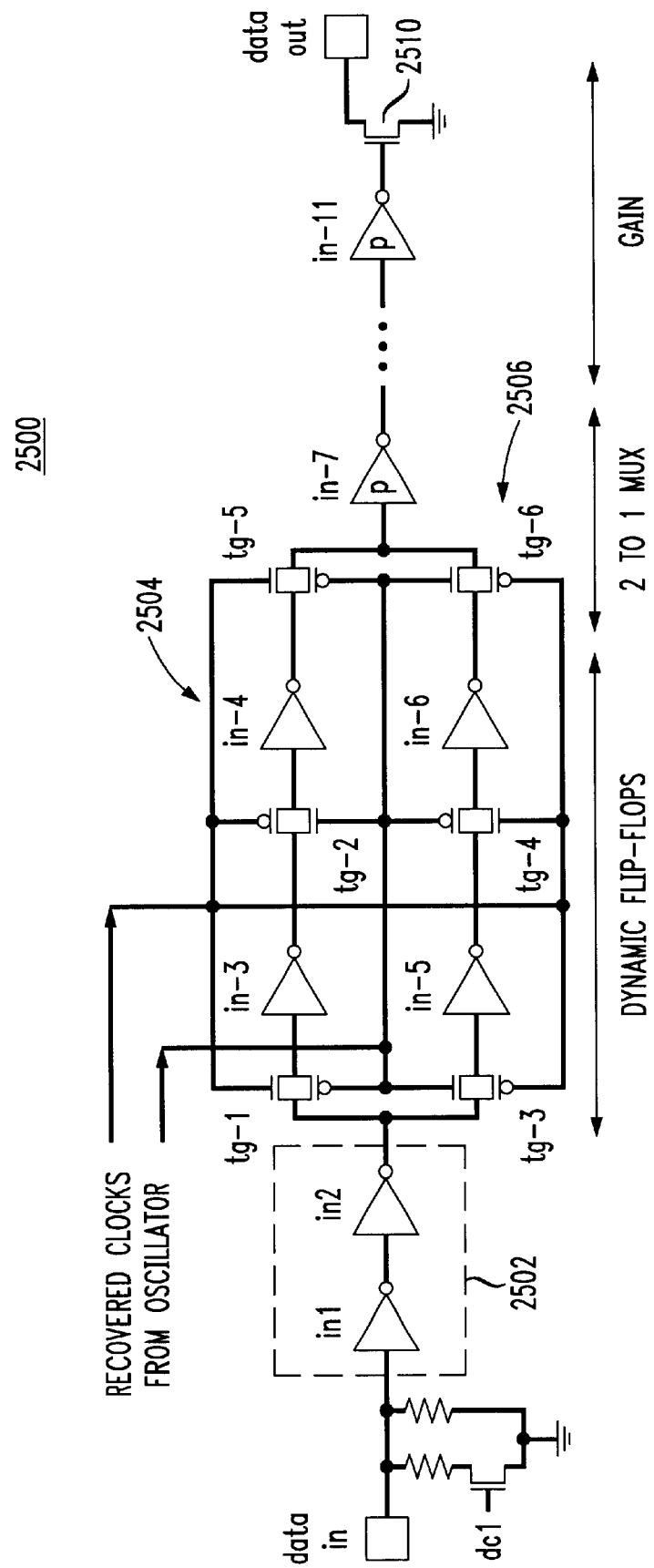
FIG. 25 shows an exemplary layout verified data path circuit configuration of the clock data recovery cell shown in FIG. 24.

FIG. 25 illustrates an exemplary layout verified data path circuit configuration of the CDR cell 2400 shown in FIG. 24.

In particular, in FIG. 25, a delay is formed using a short length of transmission line located off-chip. A two stage inverter 2502 applies the full CMOS level swings of the input data signal to the inputs of two dynamic FF's 2504, 2506. The buffered clock signals output from the injection tuned oscillator 2402 (FIG. 24) is applied to all six transmission gates tg-1 to tg-6. The FF's 2504, 2506 demux the input signal into two 2.8 Gb/s signals.

This CDR cell 2400 has been demonstrated to operate error-free using a $2^7-1$ pseudo-random data stream operating at 5.6 Gb/s. Moreover, all components including the inductor may be integrated into one die.

The on-chip inductance of the disclosed embodiment is 1 nH. Moreover, as shown, the recovered clock signal is preferably buffered with buffers In-7 to In-11 before being applied to an open drain n-channel device 2510.

Thus, an injection tuned LC tank circuit constructed in accordance with the principles of the present invention can be enhanced with clocking FF's to perform data and clock recovery on, e.g., NRZ pseudo random data. In such a case, a tank circuit is phase and frequency locked to the first sub-harmonic of a source clock signal.

While the invention has been described with reference to the exemplary embodiments thereof, those skilled in the art will be able to make various modifications to the described embodiments of the invention without departing from the true spirit and scope of the invention.

What is claimed is:

1. A clock injection system, comprising:

a clocked logic element;

a parasitic impedance between an input to said clocked logic element and an output data signal from said clocked logic element; and an impedance between a clock signal and said output data signal, said impedance being adapted to vary an energy of said clock signal embedded in said output data signal based on said parasitic impedance.

2. The clock injection system according to claim 1, wherein:

said energy of said clock is increased by said impedance.

3. The clock injection system according to claim 1, wherein:

said clock signal is input to said clocked logic element.

4. The clock injection system according to claim 1, wherein:

said clocked logic element includes a flip-flop.

5. The clock injection system according to claim 1, wherein:

said impedance is a capacitor.

6. A method of injecting a clock signal into a data signal, comprising:

embedding a clock signal into a data signal by directly injecting said clock signal into said data signal using an impedance element connected between said clock signal and said data signal whereby, energy of said clock signal is varied.

7. The method of injecting a clock signal into a data signal according to claim 6, wherein:

said impedance element is a passive element.

8. The method of injecting a clock signal into a data signal according to claim 7, wherein:

said passive element is a capacitor.

9. A method of injecting a clock signal into a data signal, comprising:

intentionally varying an impedance between said clock signal and said data signal to vary energy of said clock signal embedded in said data signal.

10. The method of injecting a clock signal into a data signal according to claim 9, wherein:

said impedance is intentionally increased.

11. A method of injecting a clock signal into a data signal, comprising:

intentionally varying an impedance between a clock signal and a data signal to vary energy of said clock signal embedded in said data signal;

wherein said impedance is intentionally increased by the addition of a capacitor between said clock signal and said data signal.

12. The method of injecting a clock signal into a data signal according to claim 11, wherein:

said capacitor is a discrete capacitor.

13. The method of injecting a clock signal into a data signal according to claim 9, further comprising:

recovering said clock signal from said data signal.

14. The method of injecting a clock signal into a data signal according to claim 13, wherein:

said clock signal is recovered using an LC tank oscillator circuit.

15. A method of injecting a clock signal into a data signal, comprising:

intentionally varying an impedance between a clock signal and a data signal to vary energy of said clock signal embedded in said data signal; and recovering said clock signal from said data signal;

wherein said clock signal is recovered using a bandpass filter.

16. Apparatus for injecting a clock signal into a data signal, comprising:

means for receiving said injected clock signal and means for intentionally varying a capacitance between said injected clock signal and said data signal to vary energy of said injected clock signal embedded in said data signal.

17. The apparatus for injecting a clock signal into a data signal according to claim 16, wherein said means for intentionally varying said capacitance comprises:

a capacitor between said clock signal and said data signal.

18. The apparatus for injecting a clock signal into a data signal according to claim 17, wherein:

said capacitor is a discrete capacitor.

19. The apparatus for injecting a clock signal into a data signal according to claim 16, further comprising:

means for recovering said clock signal from said data signal.

20. The apparatus for injecting a clock signal into a data signal according to claim 19, wherein said means for recovering said clock signal comprises:

an LC tank oscillator circuit.

21. Apparatus for injecting a clock signal into a data signal, comprising:

means for intentionally varying a capacitance between a clock signal and a data signal to vary energy of said clock signal embedded in said data signal;

means for recovering said clock signal from said data signal; and a bandpass filter.

* * * * *